United States Patent
Shin et al.

(10) Patent No.: US 11,348,641 B2
(45) Date of Patent: May 31, 2022

(54) MEMORY DEVICE AND METHOD OF OPERATING THE SAME

(71) Applicant: SK hynix Inc., Gyeonggi-do (KR)

(72) Inventors: Jae Hyeon Shin, Gyeonggi-do (KR); Gwi Han Ko, Gyeonggi-do (KR); Sung Hun Kim, Gyeonggi-do (KR); Hyung Jin Choi, Ulsan (KR)

(73) Assignee: SK hynix Inc., Gyeonggi-do (KR)

( * ) Notice: Subject to any disclaimer, the term of this patent is extended or adjusted under 35 U.S.C. 154(b) by 14 days.

(21) Appl. No.: 16/856,137

(22) Filed: Apr. 23, 2020

(65) Prior Publication Data
US 2021/0158871 A1 May 27, 2021

(30) Foreign Application Priority Data
Nov. 21, 2019 (KR) .......................... 10-2019-0150808

(51) Int. Cl.
*G11C 16/08* (2006.01)
*G11C 16/04* (2006.01)
*G11C 16/10* (2006.01)
*G06F 3/06* (2006.01)
*G11C 16/34* (2006.01)

(52) U.S. Cl.
CPC ............ *G11C 16/08* (2013.01); *G06F 3/0604* (2013.01); *G06F 3/0659* (2013.01); *G06F 3/0679* (2013.01); *G11C 16/0483* (2013.01); *G11C 16/10* (2013.01); *G11C 16/3459* (2013.01)

(58) Field of Classification Search
CPC ..... G11C 16/08; G11C 16/0483; G11C 16/10; G11C 16/3459; G11C 16/30; G06F 3/0679; G06F 3/0604; G06F 3/0659

USPC .......................................................... 711/103
See application file for complete search history.

(56) References Cited

U.S. PATENT DOCUMENTS

| | | | | |
|---|---|---|---|---|
| 2011/0019486 | A1* | 1/2011 | Jang | G11C 16/0483 365/185.25 |
| 2016/0240264 | A1* | 8/2016 | Hosono | G11C 16/10 |
| 2018/0373605 | A1* | 12/2018 | Kim | G06F 3/0659 |

FOREIGN PATENT DOCUMENTS

| KR | 10-1463584 | 11/2014 |
|---|---|---|
| KR | 10-2019-0131898 | 11/2019 |

* cited by examiner

*Primary Examiner* — Hoai V Ho
*Assistant Examiner* — Minh Dinh
(74) *Attorney, Agent, or Firm* — IP & T Group LLP

(57) ABSTRACT

A memory device and method of operating the same. A memory device includes a memory block, a peripheral circuit, and a program operation controller. The memory block includes a first sub block connected to a first drain select line and a first source select line, and a second sub block connected to a second drain select line and a second source select line, and each of the first sub block and the second sub block is connected to a plurality of word lines and a common source line. The program operation controller controls the peripheral circuit to transfer a precharge voltage to the channel region through the common source line or a plurality of bit lines connected the memory block, and to apply a control voltage to the first and second source select lines at different time points or to apply the control voltage to the first and second drain select lines at different time points in the step of precharging the channel region.

19 Claims, 19 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2019-0150808, filed on Nov. 21, 2019, which is incorporated herein by reference in its entirety.

BACKGROUND

Field of Invention

The present disclosure relates to an electronic device, and more particularly, to a memory device and a method of operating the same.

Description of Related Art

A storage device is a device that stores data under control of a host device such as a computer or a smartphone. A storage device may include a memory device in which data is stored and a memory controller controlling the memory device. The memory device is divided into a volatile memory device and a non-volatile memory device.

A volatile memory device is a device that stores data only when power is supplied and loses the stored data when the power supply is cut off. Examples of volatile memory devices include a static random access memory (SRAM), a dynamic random access memory (DRAM), and the like.

A non-volatile memory device is a device that does not lose data even though power is cut off. Examples of non-volatile memory devices include a read only memory (ROM), a programmable ROM (PROM), an electrically programmable ROM (EPROM), an electrically erasable and programmable ROM (EEPROM), a flash memory, and the like.

SUMMARY

Various embodiments of the present disclosure provide a memory device having improved program performance and a method of operating the same.

A memory device according to an embodiment of the present disclosure includes a memory block, a peripheral circuit, and a program operation controller. The memory block includes a first sub block connected to a first drain select line and a first source select line, and a second sub block connected to a second drain select line and a second source select line, and each of the first sub block and the second sub block is connected to a plurality of bit lines, a plurality of word lines and a common source line. The peripheral circuit performs a program loop including a program voltage apply step of applying a program voltage to a selected word line among the plurality of word lines, a verify step of verifying a program state of memory cells connected to the selected word line, and a step of precharging a channel region of the memory block. The program operation controller controls the peripheral circuit to transfer a precharge voltage to the channel region through the common source line or the plurality of bit lines, in the step of precharging the channel region, and controls the peripheral circuit to apply a control voltage to the first and second source select lines at different time points or to apply the control voltage to the first and second drain select lines at different time points.

In a method of operating a memory device according to an embodiment of the present disclosure, the memory device includes a memory block including first and second sub blocks, the first sub block is connected to a first drain select line and a first source select line, the second sub block is connected to a second drain select line and a second source select line, and each of the first and second sub blocks is connected to a plurality of bit lines, a plurality of word lines, and a common source line. The method of operating the memory device includes discharging a verify voltage applied to a selected word line among the plurality of word lines, and precharging a channel region of the memory block through the common source line. The precharging includes applying a control voltage to the first source select line and the second source select line at different time points.

In a method of operating a memory device according to an embodiment of the present disclosure, the memory device includes a memory block including first and second sub blocks, the first sub block is connected to a first drain select line and a first source select line, the second sub block is connected to a second drain select line and a second source select line, and each of the first and second sub blocks is connected to a plurality of bit lines, a plurality of word lines, and a common source line. The method of operating the memory device includes discharging a verify voltage applied to a selected word line among the plurality of word lines, and precharging a channel region of the memory block through the plurality of bit lines. The precharging includes applying a control voltage to the first drain select line and the second drain select line at different time points.

In a method of operating a memory device according to an embodiment of the present disclosure, the operating method comprises applying a precharge voltage to a common source line and turning on respective selection transistors at different time points to transfer the precharge voltage to a channel region of cell strings respectively including the selection transistors, wherein the cell strings are included in different memory regions.

According to the present technology, a memory device having improved program performance and a method of operating the same are provided.

DETAILED DESCRIPTION

Hereinafter, the present disclosure will be described in detail by describing various embodiment of the present disclosure with reference to the accompanying drawings.

Figure 1:
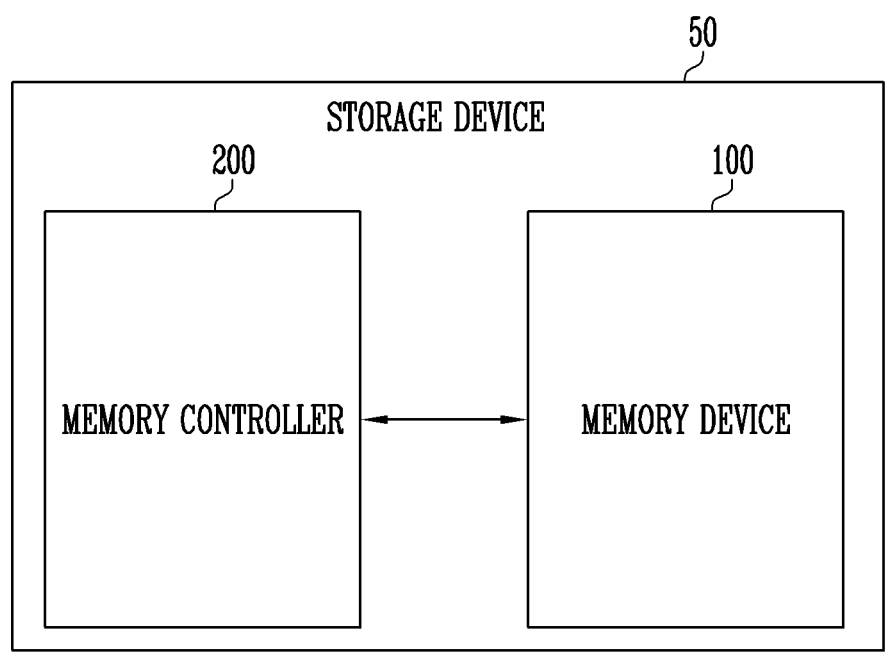
FIG. 1 is a diagram for describing a storage device according to an embodiment of the present disclosure.

FIG. 1 is a diagram for describing a storage device according to an embodiment of the present disclosure.

Referring to FIG. 1, the storage device 50 may include a memory device 100 and a memory controller 200 controlling an operation of the memory device 100. The storage device 50 is a device that stores data under control of a host such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface which is a communication method with the host. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates in response to control of the memory controller 200. The memory device 100 may include a memory cell array including a plurality of memory cells for storing the data.

Each of the memory cells may be configured as a single level cell (SLC) that stores one data bit, a multi-level cell (MLC) that stores two data bits, a triple level cell (TLC) that stores three data bits, or a quad level cell (QLC) that stores four data bits.

The memory cell array may include a plurality of memory blocks. Each of the memory blocks may include a plurality of memory cells. One memory block may include a plurality of pages. In an embodiment, a page may be a unit for storing data in the memory device 100 or reading data stored in the memory device 100.

The memory block may be a unit for erasing data. In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, for convenience of description, the memory device 100 is a NAND flash memory.

The memory device 100 is configured to receive a command and an address from the memory controller 200, and access an area selected by the address in the memory cell array. That is, the memory device 100 may perform an operation instructed by the command on the area selected by the address. For example, the memory device 100 may perform a write operation (program operation), a read operation, and an erase operation. During the program operation, the memory device 100 may program data to the area selected by the address. During the read operation, the memory device 100 may read data from the area selected by the address. During the erase operation, the memory device 100 may erase data stored in the area selected by the address.

The memory controller 200 controls overall operations of the storage device 50.

When power is applied to the storage device 50, the memory controller 200 may execute firmware FW. When the memory device 100 is a flash memory device, the memory controller 200 may operate firmware such as a flash translation layer (FTL) for controlling communication between the host and the memory device 100.

In an embodiment, the memory controller 200 may receive data and a logical block address (LBA) from the host and convert the logical block address (LBA) into a physical block address (PBA) indicating an address of memory cells included in the memory device 100 in which data is to be stored.

The memory controller 200 may control the memory device 100 to perform the program operation, the read operation, or the erase operation in response to a request from the host. During the program operation, the memory controller 200 may provide a write command, a physical block address, and data to the memory device 100. During the read operation, the memory controller 200 may provide a read command and the physical block address to the memory device 100. During the erase operation, the memory controller 200 may provide an erase command and the physical block address to the memory device 100.

In an embodiment, the memory controller 200 may generate and transmit the command, the address, and the data to the memory device 100 regardless of the request from the host. For example, the memory controller 200 may provide a command, an address, and data to the memory device 100 to perform background operations such as a program operation for wear leveling and a program operation for garbage collection.

In an embodiment, the memory controller 200 may control at least two memory devices 100. In this case, the memory controller 200 may control the memory devices 100 according to an interleaving method to improve operation performance. The interleaving method may be an operation method for overlapping operation periods of at least two memory devices 100.

The host may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

Figure 2:
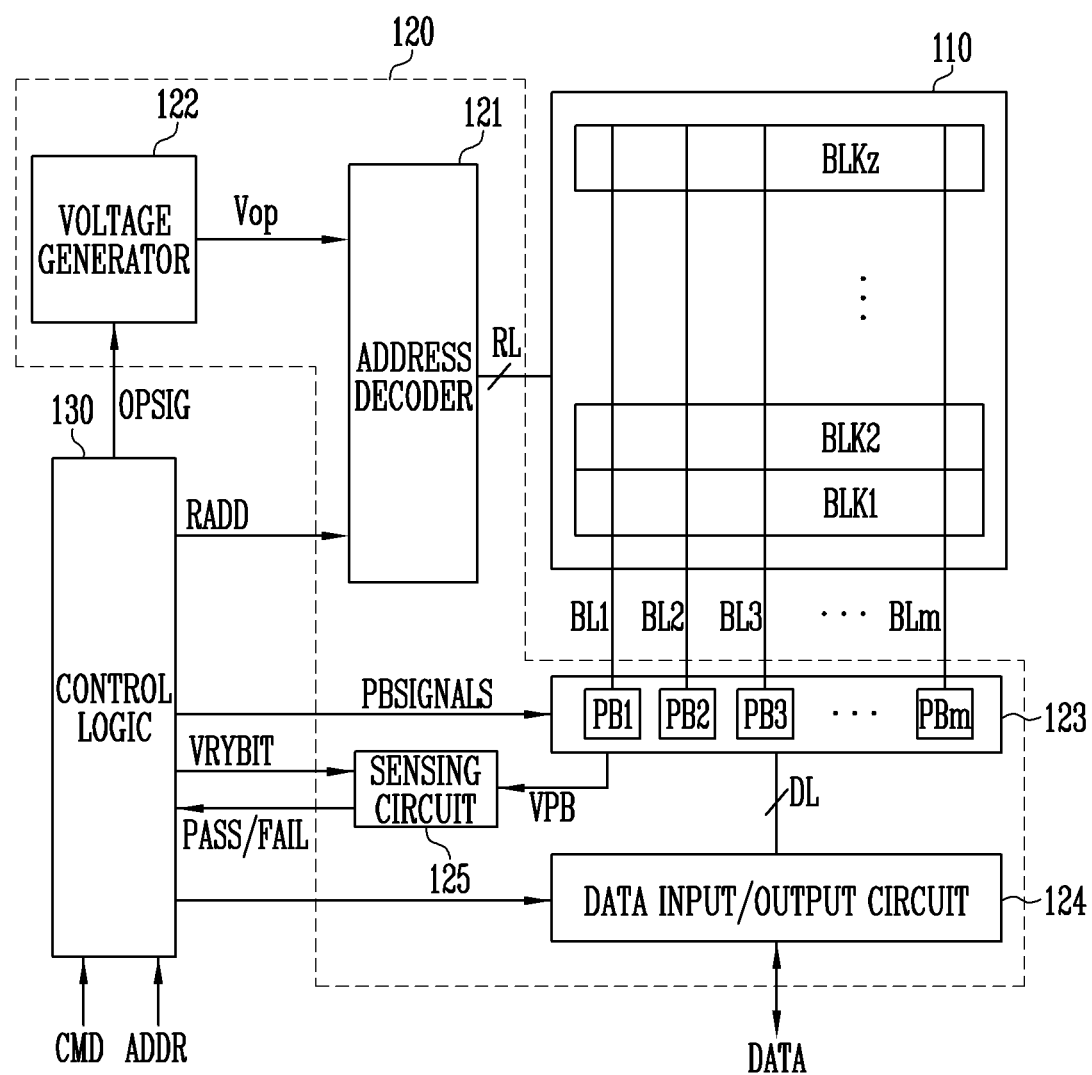
FIG. 2 is a diagram for describing a structure of a memory device of FIG. 1.

FIG. 2 is a diagram for describing a structure of the memory device of FIG. 1.

Referring to FIG. 2, a memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a read and write circuit 123 through bit lines BL1 to BLm. Each of the plurality of memory blocks BLK1 to BLKz includes a plurality of memory cells. As an embodiment, the plurality of memory cells are non-volatile memory cells. Memory cells connected to the same word line among the plurality of memory cells are defined as one physical page. That is, the memory cell array 110 is configured of a plurality of physical pages. According to an embodiment of the present disclosure, each of the plurality of memory blocks BLK1 to BLKz included in the memory cell array 110 may include a plurality of dummy cells. At least one of the dummy cells may be connected in series between a drain select transistor and the memory cells, and between a source select transistor and the memory cells.

Each of the memory cells of the memory device 100 may be configured as a single level cell (SLC) that stores one data bit, a multi-level cell (MLC) that stores two data bits, a triple level cell (TLC) that stores three data bits, or a quad level cell (QLC) that stores four data bits.

The peripheral circuit 120 may include an address decoder 121, a voltage generator 122, the read and write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is connected to the memory cell array 110 through the row lines RL. The row lines RL may include drain select lines, word lines, source select lines, and a common source line. According to an embodiment of the present disclosure, the word lines may include normal word lines and dummy word lines. According to an embodiment of the present disclosure, the row lines RL may further include a pipe select line.

The address decoder 121 is configured to operate in response to control of the control logic 130. The address decoder 121 receives a row address RADD from the control logic 130.

The address decoder 121 is configured to decode a block address of the row address RADD. The address decoder 121 selects at least one memory block among the memory blocks BLK1 to BLKz according to the decoded block address. The address decoder 121 may select at least one word line of a selected memory block by applying voltages supplied from the voltage generator 122 to at least one word line WL according to the decoded row address RADD.

During the program operation, the address decoder 121 may apply a program voltage to a selected word line and apply a pass voltage having a level less than that of the program voltage to unselected word lines. During a program verify operation, the address decoder 121 may apply a verify voltage to the selected word line and apply a verify pass voltage having a level greater than that of the verify voltage to the unselected word lines.

During the read operation, the address decoder 121 may apply a read voltage to the selected word line and apply a read pass voltage having a level greater than that of the read voltage to the unselected word lines.

According to an embodiment of the present disclosure, the erase operation of the memory device 100 is performed in unit of memory block. The address ADDR input to the memory device 100 during the erase operation includes a block address. The address decoder 121 may decode the block address and select one memory block according to the decoded block address. During the erase operation, the address decoder 121 may apply a ground voltage to the word lines connected to the selected memory block.

According to an embodiment of the present disclosure, the address decoder 121 may be configured to decode a column address of the transferred address ADDR. The decoded column address may be transferred to the read and write circuit 123. As an example, the address decoder 121 may include a component such as a row decoder, a column decoder, and an address buffer.

The voltage generator 122 is configured to generate a plurality of operation voltages Vop by using an external power voltage supplied to the memory device 100. The voltage generator 122 operates in response to the control of the control logic 130.

As an example, the voltage generator 122 may generate an internal power voltage by regulating the external power voltage. The internal power voltage generated by the voltage generator 122 is used as an operation voltage of the memory device 100.

As an embodiment, the voltage generator 122 may generate the plurality of operation voltages Vop using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selection read voltages, and a plurality of non-selection read voltages.

In order to generate the plurality of operation voltages Vop having various voltage levels, the voltage generator 122 may include a plurality of pumping capacitors that receive the internal power voltage and selectively activate the plurality of pumping capacitors to generate the plurality of operation voltages Vop.

The plurality of generated operation voltages Vop may be supplied to the memory cell array 110 by the address decoder 121.

The read and write circuit 123 includes first to m-th page buffers PB1 to PBm. The first to m-th page buffers PB1 to PBm are connected to the memory cell array 110 through first to m-th bit lines BL1 to BLm, respectively. The first to m-th page buffers PB1 to PBm operate in response to the control of the control logic 130.

The first to m-th page buffers PB1 to PBm communicate data DATA with the data input/output circuit 124. At a time of program, the first to m-th page buffers PB1 to PBm receive the data DATA to be stored through the data input/output circuit 124 and data lines DL.

During the program operation, when a program voltage is applied to the selected word line, the first to m-th page buffers PB1 to PBm may transfer the data DATA to be stored, that is, the data DATA received through the data input/output circuit 124 to the selected memory cells through the bit lines BL1 to BLm. The memory cells of the selected page are programmed according to the transferred data DATA. A memory cell connected to a bit line to which a program permission voltage (for example, a ground voltage) is applied may have an increased threshold voltage. A threshold voltage of a memory cell connected to a bit line to which a program inhibition voltage (for example, a power voltage) is applied may be maintained. During the program verify operation, the first to m-th page buffers PB1 to PBm read the data DATA stored in the memory cells from the selected memory cells through the bit lines BL1 to BLm.

During the read operation, the read and write circuit 123 may read the data DATA from the memory cells of the selected page through the bit lines BL and store the read data DATA in the first to m-th page buffers PB1 to PBm.

During the erase operation, the read and write circuit 123 may float the bit lines BL. As an embodiment, the read and write circuit 123 may include a column selection circuit.

The data input/output circuit 124 is connected to the first to m-th page buffers PB1 to PBm through the data lines DL. The data input/output circuit 124 operates in response to the control of the control logic 130.

The data input/output circuit 124 may include a plurality of input/output buffers (not shown) that receive input data DATA. During the program operation, the data input/output circuit 124 receives the data DATA to be stored from an external controller (not shown). During the read operation, the data input/output circuit 124 outputs the data DATA transferred from the first to m-th page buffers PB1 to PBm included in the read and write circuit 123 to the external controller.

During the read operation or the verify operation, the sensing circuit 125 may generate a reference current in response to a signal of a permission bit VRYBIT generated by the control logic 130 and may compare a sensing voltage VPB received from the read and write circuit 123 with a reference voltage generated by the reference current to output a pass signal or a fail signal to the control logic 130.

The control logic 130 may be connected to the address decoder 121, the voltage generator 122, the read and write circuit 123, the data input/output circuit 124, and the sensing circuit 125. The control logic 130 may be configured to control all operations of the memory device 100. The control logic 130 may operate in response to a command CMD transferred from an external device.

The control logic 130 may generate various signals in response to the command CMD and the address ADDR to control the peripheral circuit 120. For example, the control logic 130 may generate an operation signal OPSIG, the row address RADD, a read and write circuit control signal PBSIGNALS, and the permission bit VRYBIT in response to the command CMD and the address ADDR. The control logic 130 may output the operation signal OPSIG to the voltage generator 122, output the row address RADD to the address decoder 121, output the read and write control signal to the read and write circuit 123, and output the permission bit VRYBIT to the sensing circuit 125. In addition, the control logic 130 may determine whether the verify operation is passed or failed in response to the pass or fail signal PASS/FAIL output by the sensing circuit 125.

Figure 3:
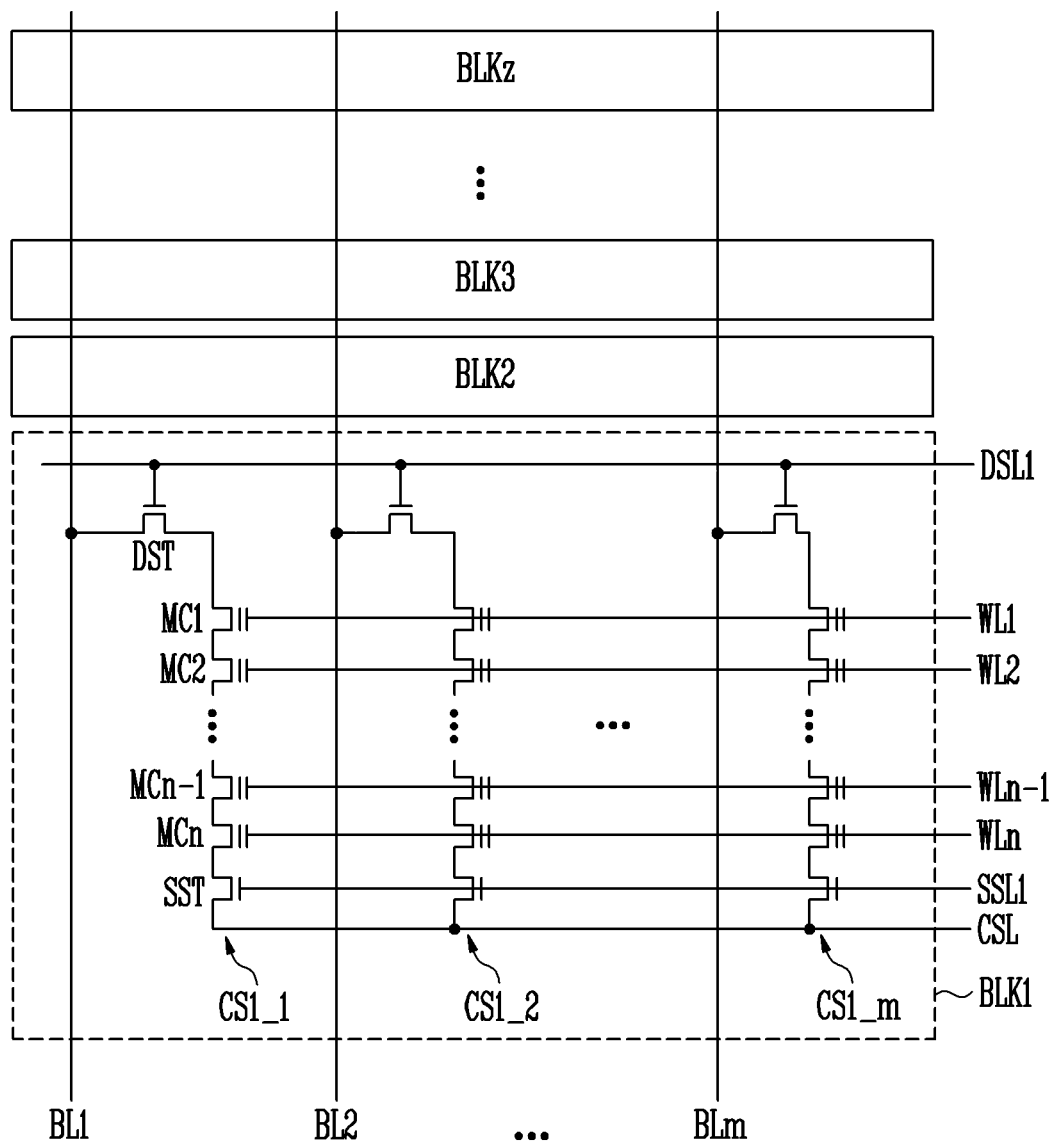
FIG. 3 is a diagram for describing an embodiment of a memory cell array of FIG. 2.

FIG. 3 is a diagram for describing an embodiment of the memory cell array of FIG. 2.

Referring to FIG. 3, the first to z-th memory blocks BLK1 to BLKz are commonly connected to the first to m-th bit lines BL1 to BLm. In FIG. 3, for convenience of description, elements included in the first memory block BLK1 of the plurality of memory blocks BLK1 to BLKz are shown, and elements included in each of the remaining memory blocks BLK2 to BLKz are omitted. It will be understood that each of the remaining memory blocks BLK2 to BLKz is configured similarly to the first memory block BLK1.

The first memory block BLK1 may include a plurality of cell strings CS1_1 to CS1_$m$ (m is a positive integer). The first to m-th cell strings CS1_1 to CS1_$m$ are connected to the first to m-th bit lines BL1 to BLm, respectively. Each of the first to m-th cell strings CS1_1 to CS1_$m$ includes a drain select transistor DST, a plurality of memory cells MC1 to MCn connected in series (n is a positive integer), and a source select transistor SST.

Gate terminals of the drain select transistors DST included in each of the first to m-th cell strings CS1_1 to CS1_$m$ are connected to a drain select line DSL1. Gate terminals of the first to n-th memory cells MC1 to MCn included in each of the first to m-th cell strings CS1_1 to CS1_$m$ are connected to the first to n-th word lines WL1 to WLn, respectively. Gate terminals of the source select transistors SST included in each of the first to m-th cell strings CS1_1 to CS1_$m$ are connected to a source select line SSL1.

For convenience of description, a structure of the cell string will be described with reference to the first cell string CS1_1 of the plurality of cell strings CS1_1 to CS1_$m$. However, it will be understood that each of the remaining cell strings CS1_2 to CS1_$m$ is configured similarly to the first cell string CS1_1.

A drain terminal of the drain select transistor DST included in the first cell string CS1_1 is connected to the first bit line BL1. A source terminal of the drain select transistor DST included in the first cell string CS1_1 is connected to a drain terminal of the first memory cell MC1 included in the first cell string CS1_1. The first to n-th memory cells MC1 to MCn are connected in series with each other. A drain terminal of the source select transistor SST included in the first cell string CS1_1 is connected to a source terminal of the n-th memory cell MCn included in the first cell string CS1_1. A source terminal of the source select transistor SST included in the first cell string CS1_1 is connected to a common source line CSL. As an embodiment, the common source line CSL may be commonly connected to the first to z-th memory blocks BLK1 to BLKz.

The drain select line DSL1, the first to n-th word lines WL1 to WLn, and the source select line SSL1 are included in row lines RL of FIG. 2. The drain select line DSL1, the first to n-th word lines WL1 to WLn, and the source select line SSL1 are controlled by the address decoder 121. The common source line CSL is controlled by the control logic 130. The first to m-th bit lines BL1 to BLm are controlled by the read and write circuit 123.

Figure 4:
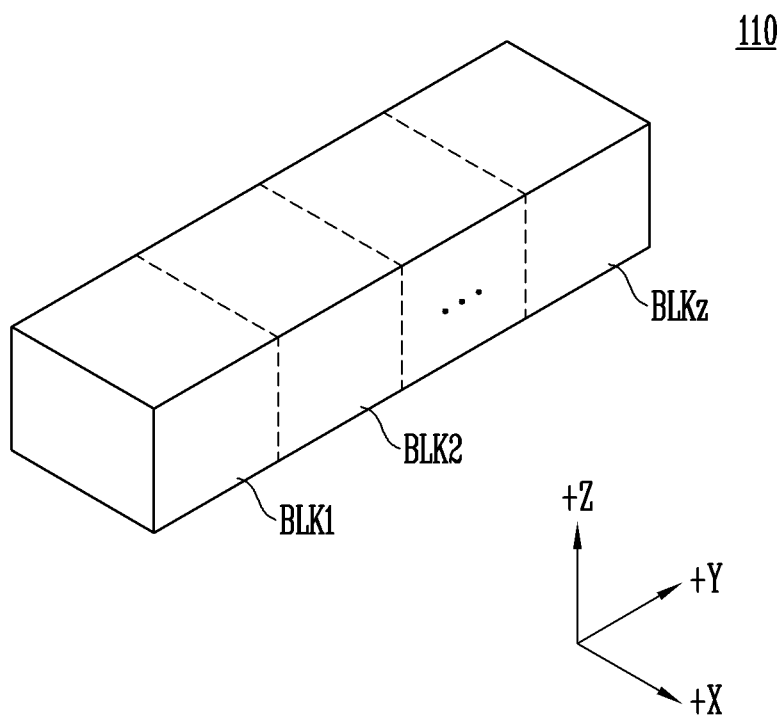
FIG. 4 is a diagram for describing another embodiment of the memory cell array of FIG. 2.

FIG. 4 is a diagram for describing another embodiment of the memory cell array of FIG. 2.

Referring to FIG. 4, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block is described in more detail with reference to FIGS. 5 and 6.

Figure 5:
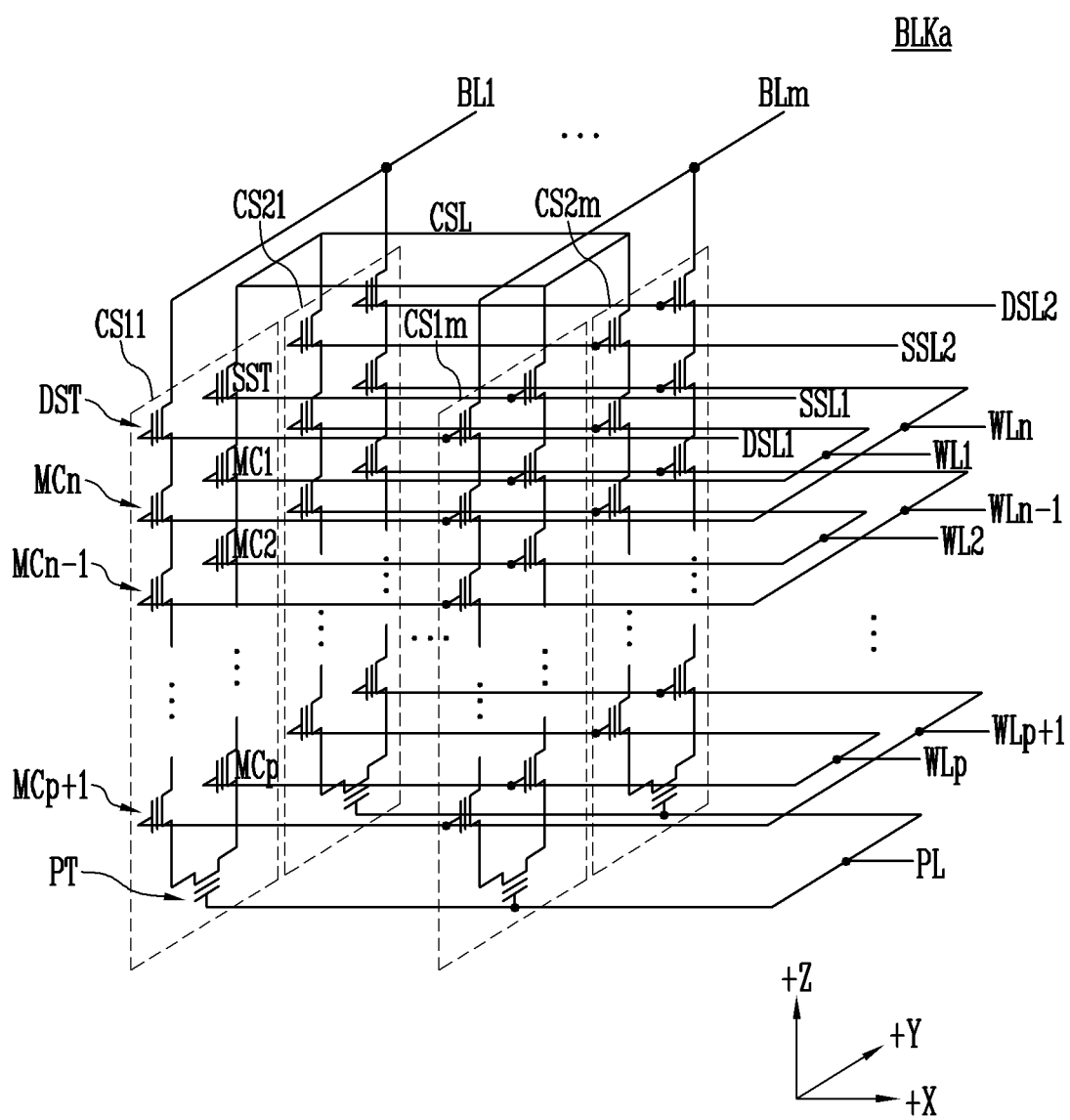
FIG. 5 is a circuit diagram illustrating a memory block BLKa of memory blocks BLK1 to BLKz of FIG. 4.

FIG. 5 is a circuit diagram illustrating a memory block BLKa among the memory blocks BLK1 to BLKz of FIG. 4.

Referring to FIG. 5, the memory block BLKa includes a plurality of cell strings CS11 to CS1m and CS21 to CS2m. As an embodiment, each of the plurality of cell strings CS11 to CS1m and CS21 to CS2m may be formed in a 'U' shape. In the memory block BLKa, m cell strings are arranged in a row direction (that is, the +X direction). In FIG. 5, two cell strings are arranged in a column direction (that is, the +Y direction). However, this is for convenience of description and it may be understood that three or more cell strings may be arranged in the column direction.

In an embodiment, one memory block may include a plurality of sub blocks. One sub block may include cell strings arranged in a 'U' shape in one column.

Each of the plurality of cell strings CS11 to CS1m and CS21 to CS2m includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an embodiment, a pillar for providing the channel layer may be provided in each cell string. As an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

As an embodiment, the source select transistors of the cell strings arranged in the same row are connected to a source select line extending in the row direction, and the source select transistors of the cell strings arranged in different rows are connected to different source select lines. In FIG. 5, the source select transistors of the cell strings CS11 to CS1m of a first row are connected to a first source select line SSL1. The source select transistors of the cell strings CS21 to CS2m of a second row are connected to a second source select line SSL2.

As another embodiment, the source select transistors of the cell strings CS11 to CS1m and CS21 to CS2m may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The cell strings arranged in the row direction are connected to the drain select line extending in the row direction. The drain select transistors of the cell strings CS11 to CS1m of the first row are connected to a first drain select line DSL1. The drain select transistors of the cell strings CS21 to CS2m of the second row are connected to a second drain select line DSL2.

The cell strings arranged in the column direction are connected to the bit lines extending in the column direction. In FIG. 5, the cell strings CS11 and CS21 of the first column are connected to the first bit line BL1. The cell strings CS1m and CS2m of the m-th column are connected to the m-th bit line BLm.

The memory cells connected to the same word line in the cell strings arranged in the row direction configure one page. For example, the memory cells connected to the first word line WL1, among the cell strings CS11 to CS1m of the first row configure one page. The memory cells connected to the first word line WL1, among the cell strings CS21 to CS2m of the second row configure another page. The cell strings arranged in one row direction may be selected by selecting any one of the drain select lines DSL1 and DSL2. One page of the selected cell strings may be selected by selecting any one of the word lines WL1 to WLn.

As another embodiment, even bit lines and odd bit lines may be provided instead of the first to m-th bit lines BL1 to BLm. In addition, even-numbered cell strings among the cell strings CS11 to CS1m or CS21 to CS2m arranged in the row direction may be connected to even bit lines, and odd-numbered cell strings among the cell strings CS11 to CS1m or CS21 to CS2m arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

Figure 6:
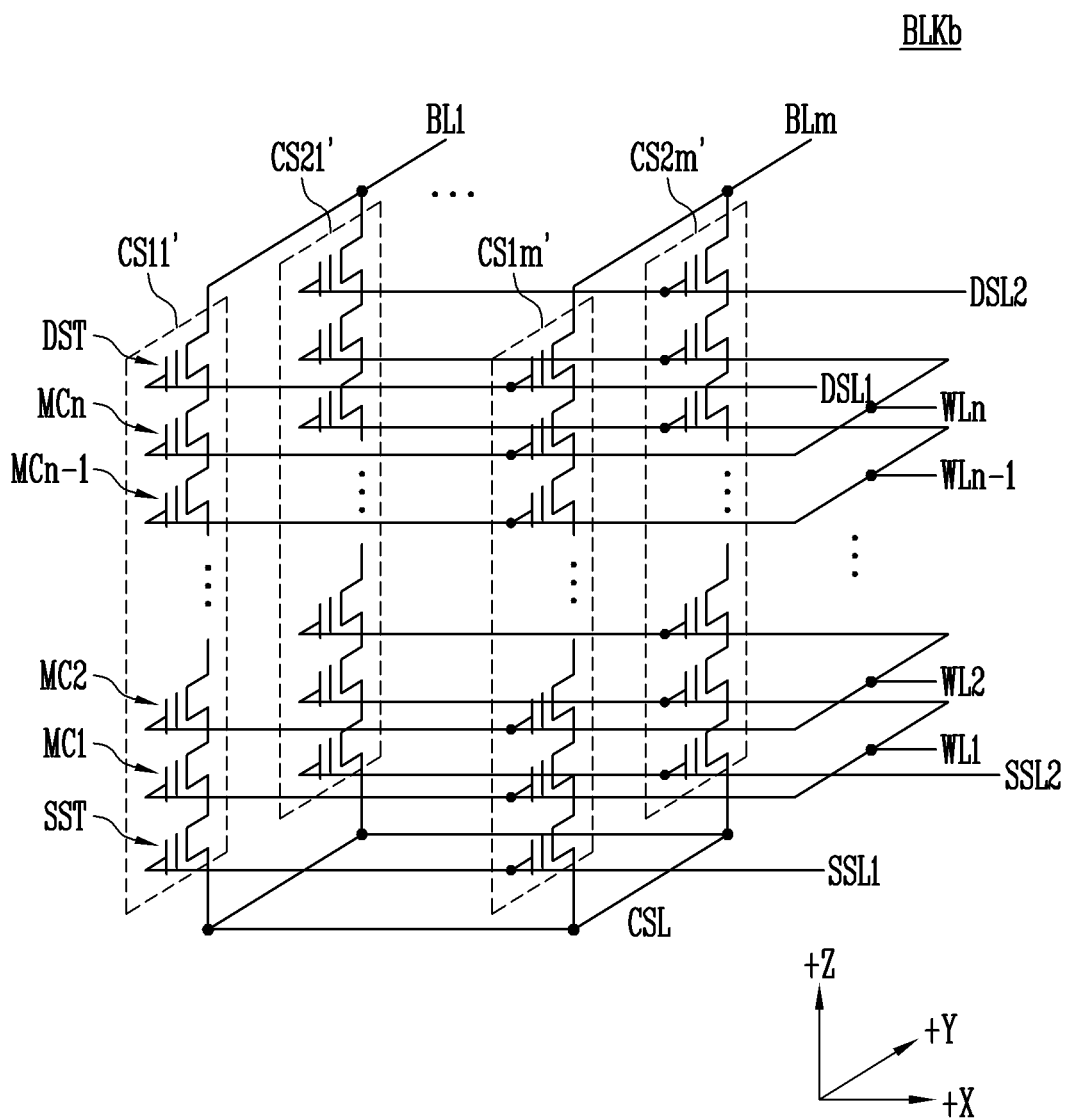
FIG. 6 is a circuit diagram illustrating another embodiment of a memory block BLKb of the memory blocks BLK1 to BLKz of FIG. 4.

FIG. 6 is a circuit diagram illustrating another embodiment of a memory block BLKb of the memory blocks BLK1 to BLKz of FIG. 4.

Referring to FIG. 6, the memory block BLKb includes a plurality of cell strings CS11' to CS1m' and CS21' to CS2m'. Each of the plurality of cell strings CS11' to CS1m' and CS21' to CS2m' extends along a +Z direction. Each of the plurality of cell strings CS11' to CS1m' and CS21' to CS2m' includes at least one source select transistor SST, first to n-th memory cells MC1 to MCn, and at least one drain select transistor DST stacked on a substrate (not shown) under the memory block BLKb.

In an embodiment, one memory block may include a plurality of sub blocks. One sub block may include cell strings arranged in an 'I' shape in one column.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. In another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

As a result, the memory block BLKb of FIG. 5 has an equivalent circuit similar to the memory block BLKa of FIG. 4 except that the pipe transistor PT is excluded from each cell string.

As another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to even bit lines, and odd-numbered cell strings among the cell strings CS11' to CS1m' or CS21' to CS2m' arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved, however, the size of the memory block BLKb increases. As less dummy memory cells are provided, the size of the memory block BLKb may be reduced, however, the reliability of the operation for the memory block BLKb may be reduced.

To efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 7:
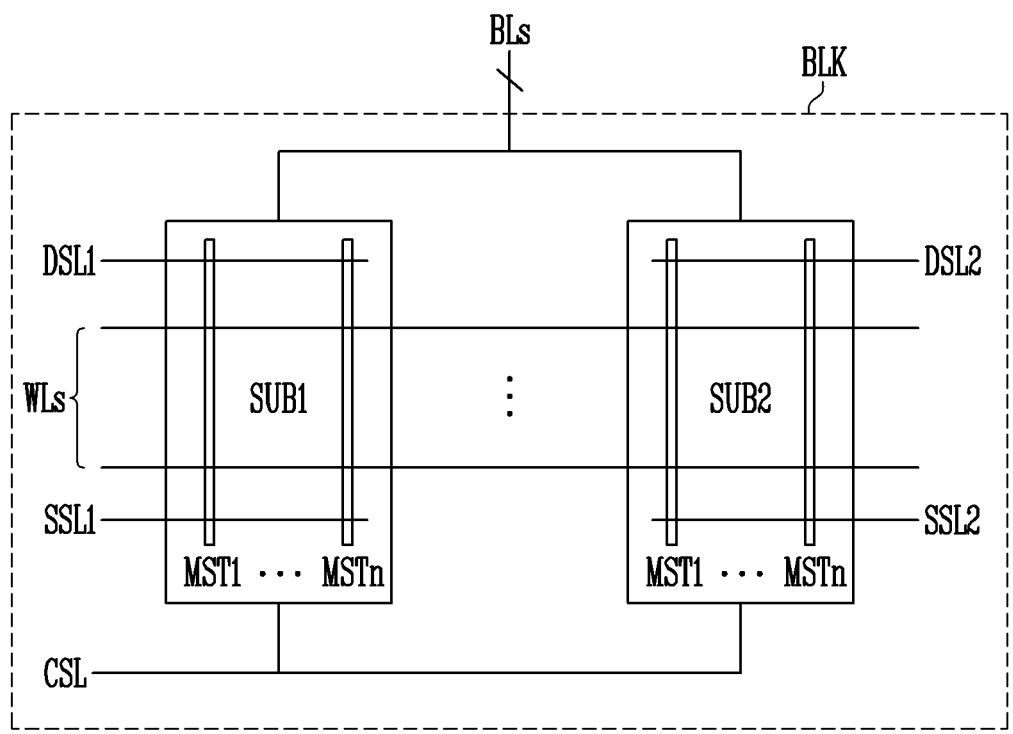
FIG. 7 is a diagram for describing a memory block and a sub block according to an embodiment of the present disclosure.

FIG. 7 is a diagram for describing the memory block and the sub block according to an embodiment of the present disclosure.

The memory block described with reference to FIG. 5 or 6 may be described in another embodiment as shown in FIG. 7.

Referring to FIG. 7, the memory block BLK may include a plurality of sub blocks SUB1 and SUB2. The number of sub blocks included in the memory block BLK is not limited to the present embodiment.

Each sub block may include a plurality of memory cell strings MST1 to MSTn. Each memory cell string may include at least one drain select transistor, a plurality of memory cells connected in series, and at least one source select transistor.

The drain select transistors included in each memory cell string in the sub block may be controlled by a drain select line, and the source select transistors may be controlled by the source select line. Memory cells included in the entire memory cell strings of the memory block BLK may be controlled by a plurality of word lines WLs.

Each memory cell string of the memory block BLK may be connected to a plurality of bit lines BLs through a drain select transistor. Each memory cell string of the memory block BLK may be connected to the common source line CSL through a source select transistor.

In FIG. 7, the first sub block SUB1 may be connected to a first drain select line DSL1 and a first source select line SSL1, and the second sub block SUB2 may be connected to a second drain select line DSL2 and a second source select line SSL2. Each of the first sub block SUB1 and the second sub block SUB2 may be connected to the plurality of bit lines BLs, the plurality of word lines WLs, and the common source line CSL. The number of drain select lines and the number of source select lines connected to one sub block are not limited to the present embodiment.

When a program operation on the first sub block SUB1 is performed, the first drain select line DSL1 may be a selected drain select line, and the first source select line SSL1 may be a selected source select line. At this time, since a program operation on the second sub block SUB2 is not performed, the second drain select line DSL2 may be an unselected drain select line, and the second source select line SSL2 may be an unselected source select line.

In an embodiment, even though a program operation on one of the plurality of sub blocks included in the memory block is performed, a channel region of the entire memory block may be precharged to prevent negative boosting. The negative boosting prevention and the channel precharge operation will be described in detail later with reference to FIGS. 8 to 14C.

Figure 8:
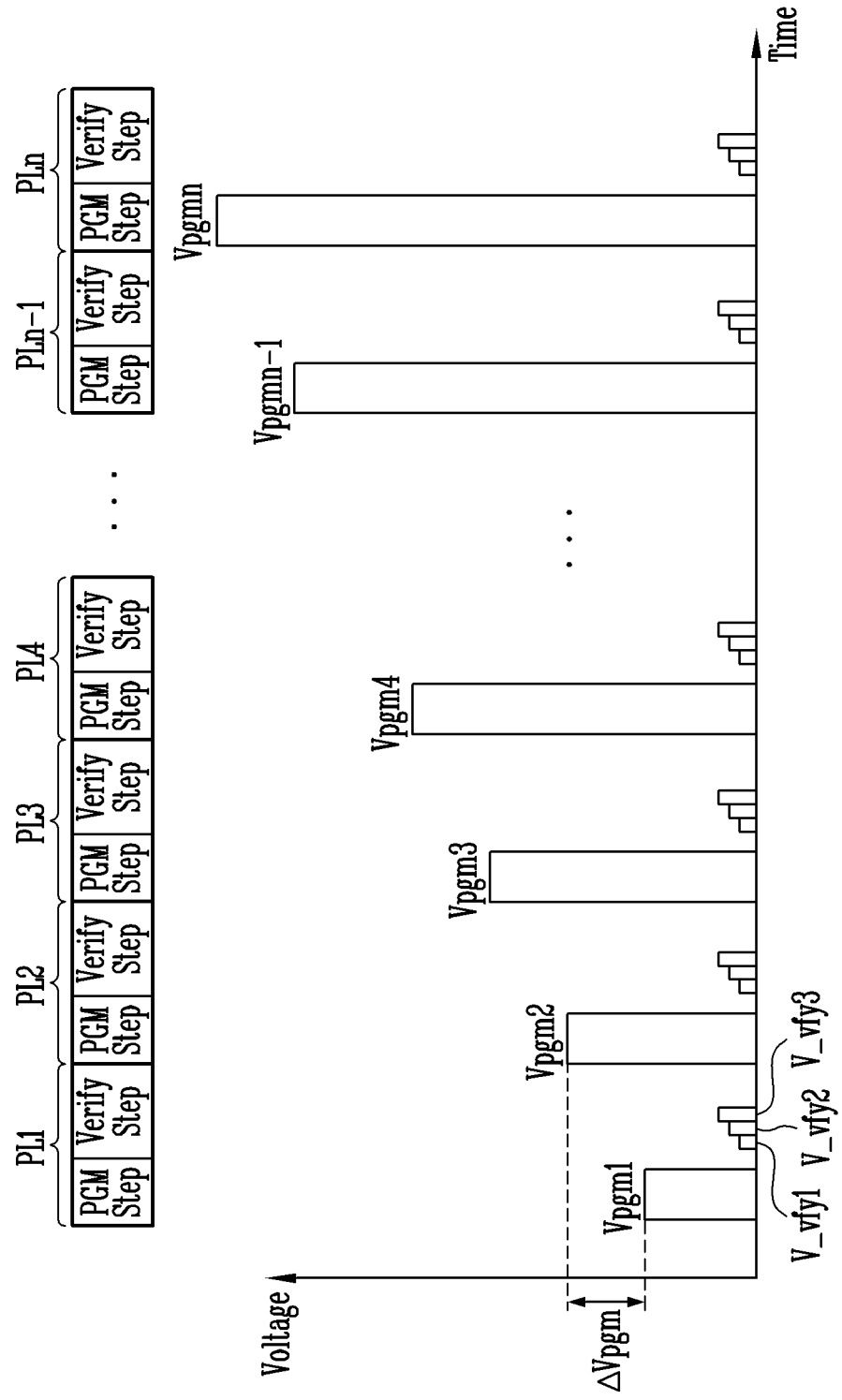
FIG. 8 is a diagram for describing a program operation of the memory device of FIG. 2.

FIG. 8 is a diagram for describing the program operation of the memory device of FIG. 2.

In FIG. 8, for convenience of description, each of the plurality of memory cells is a multi-level cell (MLC) that stores 2-bit data. However, the scope of the present disclosure is not limited thereto, and each of the plurality of memory cells may, for example, be a triple level cell (TLC) that stores 3-bit data or a quad-level cell (QLC) that stores 4-bit data.

The program operation of the memory device 100 may include a plurality of program loops PL1 to PLn. That is, the memory device 100 may perform the plurality of program loops PL1 to PLn so that the selected memory cells have a threshold voltage corresponding to any one of a plurality of program states P1, P2, and P3.

Each of the plurality of program loops PL1 to PLn may include a program voltage apply step PGM Step of applying a program voltage to a selected word line connected to the selected memory cells, and a verify step Verify Step of determining whether the memory cells are programmed by applying verify voltages.

For example, when a first program loop PL1 is performed, first to third verify voltages V_vfy1 to V_vfy3 are sequentially applied to verify the program state of the plurality of memory cells after a first program pulse Vpgm1 is applied. At this time, the memory cells having a target program state which is a first program state P1 may be verified by a first verify voltage V_vfy1, the memory cells having a target program state which is a second program state P2 may be verified by a second verify voltage V_vfy2, and the memory cells having a target program state which is a third program state P3 may be verified by a third verify voltage V_vfy3.

The memory cells which pass the verification performed by applying the respective verify voltages V_vfy1 to V_vfy3 may be determined to have the target program state, and then are program inhibited in the second program loop PL2. A second program pulse Vpgm2 higher than the first program pulse Vpgm1 by a unit voltage ΔVpgm is applied to program the remaining memory cells except for the program inhibited memory cells in the second program loop PL2. Thereafter, the verify operation is performed in the same manner as the verify operation of the first program loop PL1. For example, the verify pass indicates that the memory cell is read as an off-cell by a corresponding verify voltage.

As described above, when the memory device 100 programs the multi-level cell (MLC) that stores 2-bits, the memory device 100 verifies each of the memory cells of which the program state is the target program state using the first to third verify voltages V_vfy1 to V_vfy3.

During the verify operation, the verify voltage may be applied to the selected word line, which is the word line to which the selected memory cells are connected, and the page buffer of FIG. 2 may determine whether the verification of the memory cells is passed based on a current or a voltage flowing through the bit lines connected to the selected memory cells, respectively.

Figure 9:
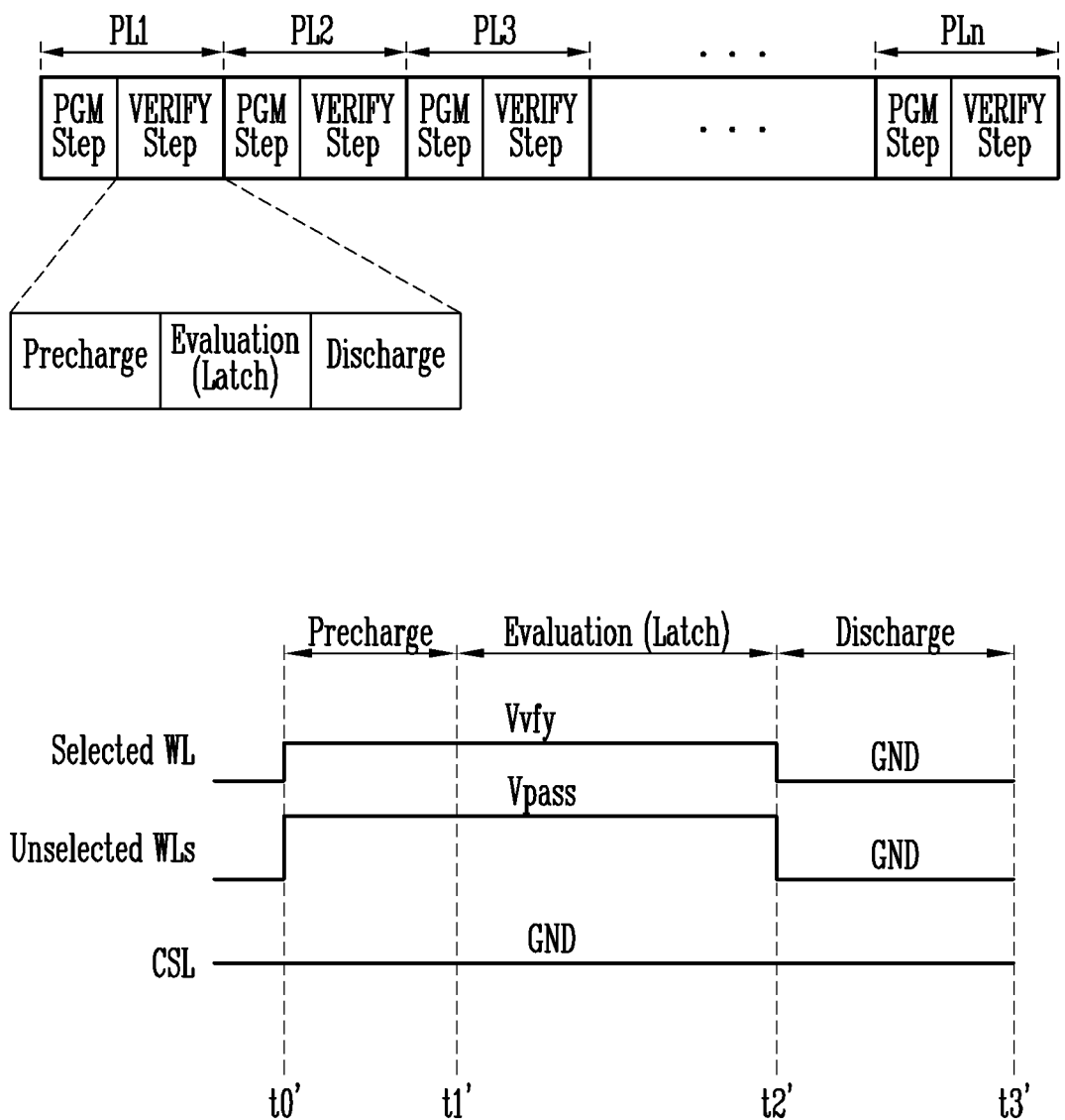
FIG. 9 is a diagram for describing a verify step of FIG. 8 in detail.

FIG. 9 is a diagram for describing the verify step of FIG. 8 in detail.

Referring to FIG. 9, the program operation of the memory device may include the plurality of program loops PL1 to PLn. That is, the memory device may program the memory cells to have one of a plurality of program states by performing the plurality of program loops PL1 to PLn.

Each of the plurality of program loops PL1 to PLn may include a program voltage apply step PGM Step of applying a program voltage to a selected word line, and a verify step Verify Step of determining whether the memory cells are programmed by applying a verify voltage Vvfy.

The verify step included in each program loop may include a precharge period, an evaluation period, and a discharge period.

The precharge period is a period in which the page buffer connected to the memory cell precharges the bit line BL with a bit line voltage corresponding to the target program state of the memory cell through a sensing node SO connected to the bit line.

Specifically, in the period t0' to t1', the verify voltage Vvfy corresponding to a program state to be verified is applied to the selected word line Sel WL. A verify pass voltage Vpass for turning on the memory cells so that the memory cells connected to the unselected word line do not affect a voltage of the bit line may be applied to the unselected word line Unsel WL. A ground voltage corresponding to 0V may be applied to the common source line CSL.

An evaluation period t1' to t2' is a period for sensing a voltage of the bit line BL determined according to a current flowing through the memory cell. The memory device may store a state of the memory cell according to the voltage of the bit line BL. The state of the memory cell may correspond to a verify pass or a verify fail. When a threshold voltage of the memory cell is higher than the verify voltage Vvfy applied to the word line, the memory cell is read as an off-cell and the memory cell read as the off-cell may correspond to a verify pass state. In contrast, when the threshold voltage of the memory cell is lower than the verify voltage Vvfy applied to the word line, the memory cell is read as an on-cell and the memory cell read as the on-cell may correspond to a verify fail state.

The discharge period t2' to t3' is a period for discharging voltages applied to the word lines and select lines (not shown). The memory device may discharge the voltages applied to the word lines and the select lines (not shown) by applying a ground voltage corresponding to 0V to the word lines and the select lines (not shown).

Figure 10A:
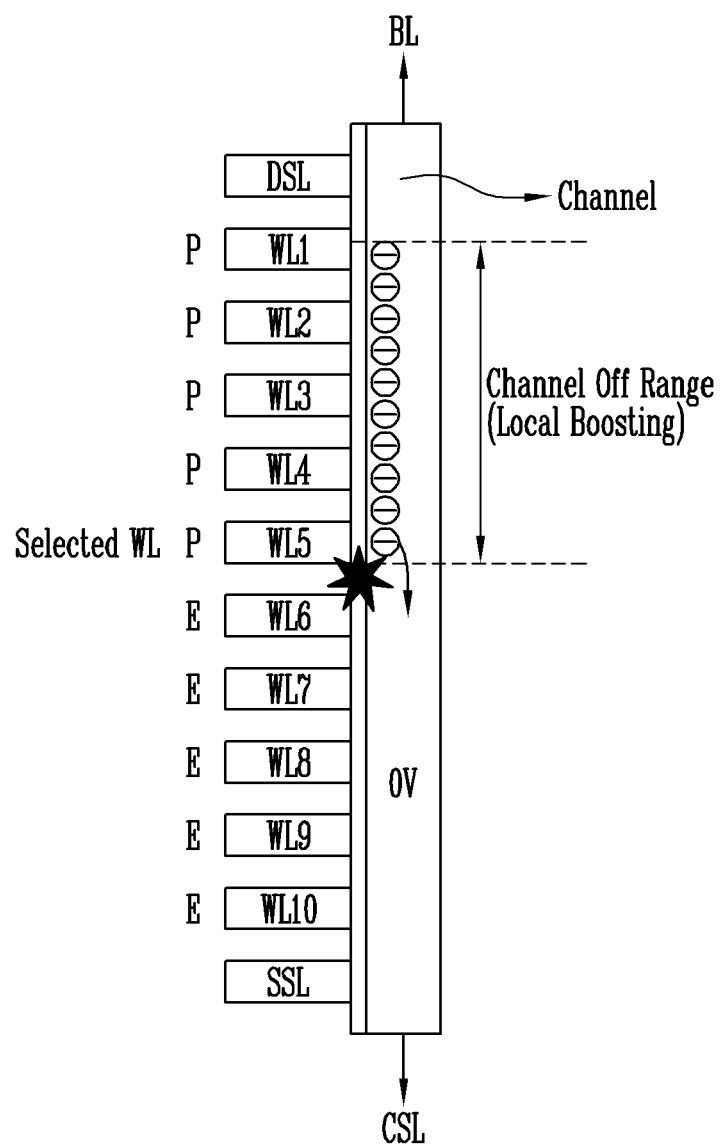
FIG. 10A is a diagram for describing channel negative boosting.

FIG. 10A is a diagram for describing channel negative boosting.

In FIG. 10A, an unselected memory cell string is shown. The memory cell string may include a plurality of memory cells connected in series between the bit line BL and the common source line CSL. Each of the memory cells may be connected to word lines, respectively. A drain select transistor may be connected between the memory cells and the bit line, and a source select transistor may be connected between the memory cells and the common source line. The drain select transistor may be controlled through the drain select line, and the source select transistor may be controlled through the source select line.

In the described embodiment of FIG. 10A, the memory cell string is connected to ten word lines WL1 to WL10, and a program operation is sequentially performed in a direction from the first word line WL1 to the tenth word line WL10. The program operation may be sequentially performed in a direction from the drain select line DSL to the source select line SSL. The selected word line is the fifth word line WL5. Therefore, the memory cells connected to the first to fourth word lines WL1 to WL4 are programmed memory cells, and the memory cells connected to the sixth to tenth word lines WL6 to WL10 are memory cells before being programmed. Therefore, the memory cells connected to the sixth to tenth word lines WL6 to WL10 may have a threshold voltage corresponding to an erase state E. Therefore, a channel off region, that is, a local boosting region, may be formed in a channel corresponding to the memory cells connected to the first to fifth word lines WL1 to WL5.

In the discharge period described with reference to FIG. 9, the word lines are discharged to the ground voltage. Therefore, charges of a channel off region may be negatively down coupled. This is called negative boosting or under coupling. Therefore, the number of negative charges included in the channel off region may increase.

Since a voltage of a channel corresponding to the memory cells connected to the sixth to tenth word lines WL6 to WL10 is connected to the common source line CSL, the voltage may be the ground voltage (that is, 0V). Therefore, as a voltage difference between a negative voltage and the ground voltage (0V) in the channel off region increases, the memory cells corresponding to the erase state E may be programmed by band to band tunneling (BTBT) or hot carrier injection (HCI). In this case, in order to prevent negative boosting, a channel precharge operation for controlling the source select line SSL to increase a potential of the channel through the common source line may be performed.

In another embodiment, a program operation (not shown) is sequentially performed in a direction from the tenth word line WL10 to the first word line WL1. The program operation may be sequentially performed in a direction from the source select line SSL to the drain select line DSL. The selected word line is the fifth word line WL5. Therefore, the memory cells connected to the sixth to tenth word lines WL6 to WL10 are programmed memory cells, and the memory cells connected to the first to fourth word lines WL1 to WL4 are memory cells before being programmed. Therefore, the memory cells connected to the first to fourth word lines WL1 to WL4 may have a threshold voltage corresponding to the erase state E. Therefore, a channel off region, that is, a local boosting region, may be formed in a channel corresponding to the memory cells connected to the fifth to tenth word lines WL5 to WL10. In this case, in order to prevent negative boosting, a channel precharge operation for controlling the drain select line DSL to increase the potential of the channel through the bit line may be performed.

In an embodiment of the present disclosure, a memory device and a method of operating the same that prevent the negative boosting by performing a step of precharging the channel through the common source line or the bit line between a verify step of a current program loop and a program voltage apply step of a next program loop are provided.

Specifically, in an embodiment of the present disclosure, the memory device and a method of operating the same that prevent generation of a peak current by applying a control voltage to the source select lines (or drain select lines) at different time points in a channel precharge step for preventing the negative boosting are provided.

Hereinafter, a program operating method according to an embodiment of the present disclosure will be described in more detail with reference to FIGS. 10B to 14C.

Figure 10B:
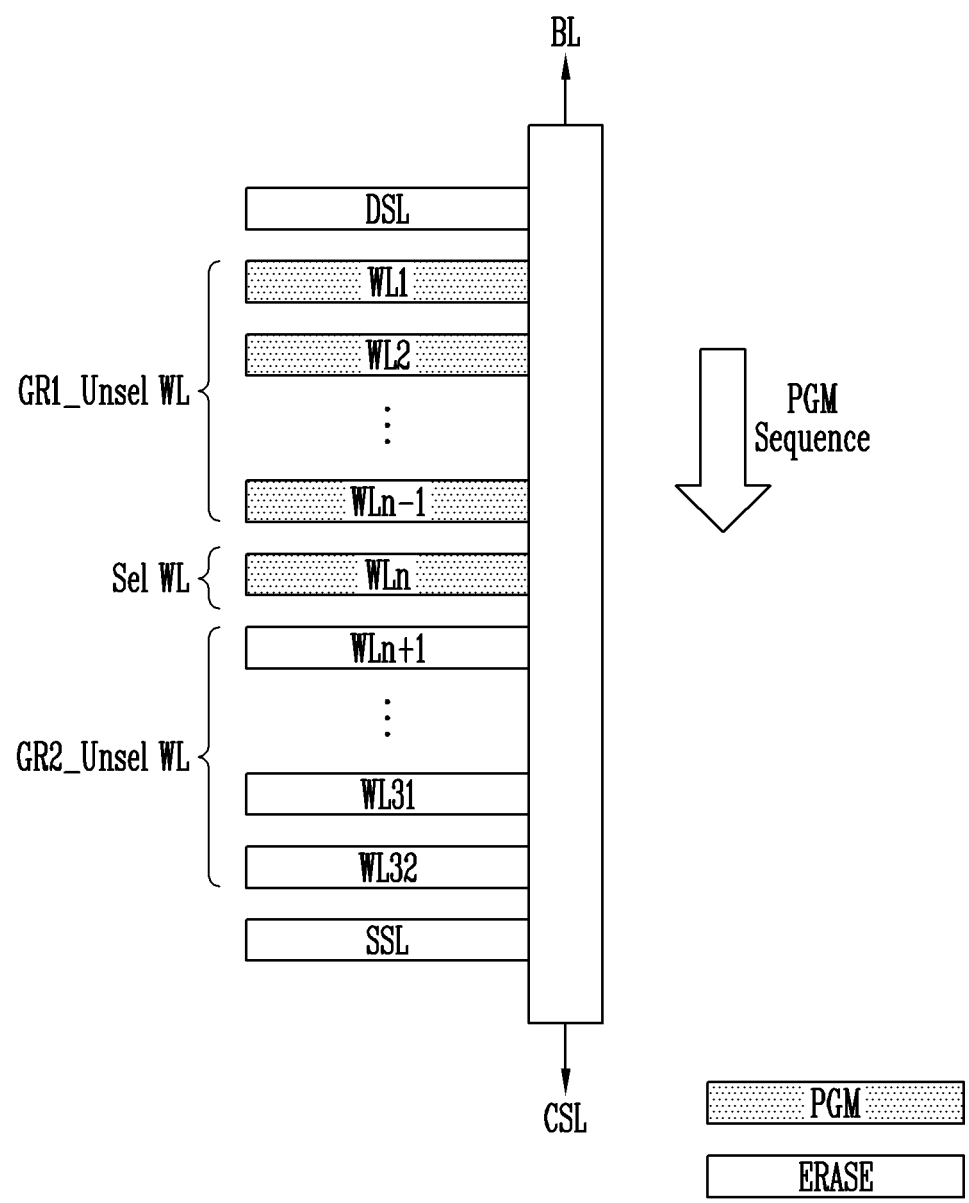
FIG. 10B is a diagram for describing a program sequence according to an embodiment of the present disclosure.

FIG. 10B is a diagram for describing a program sequence according to an embodiment of the present disclosure.

Referring to FIG. 10B, a memory cell string is connected to first to thirty-second word lines WL1 to WL32. The number of word lines connected to the memory cell string is not limited to the present embodiment.

In FIG. 10B, an n-th word line WLn may be a selected word line Sel WL on which a program operation is currently to be performed. A first unselected word line group GR1_Unsel WL may include first to (n−1)-th word lines WL1 to WLn−1. A second unselected word line group GR2_Unsel WL may include (n+1)-th to thirty-second word lines WLn+1 to WL32.

The program operation may be performed in a direction from the drain select line DSL to the source select line SSL. Therefore, the first unselected word line group GR1_Unsel WL may include word lines positioned between the drain select line DSL and the selected word line Sel WL. The second unselected word line group GR2_Unsel WL may include word lines positioned between the selected word line Sel WL and the source select line SSL.

Alternatively, the first unselected word line group GR1_Unsel WL may include the unselected word line on which the program operation is performed, and the second unselected word line group GR2_Unsel WL may include the unselected word line on which the program operation is to be performed. The word line on which the program operation is to be performed may be the word line connected to the memory cell having the erase state.

Figure 10C:
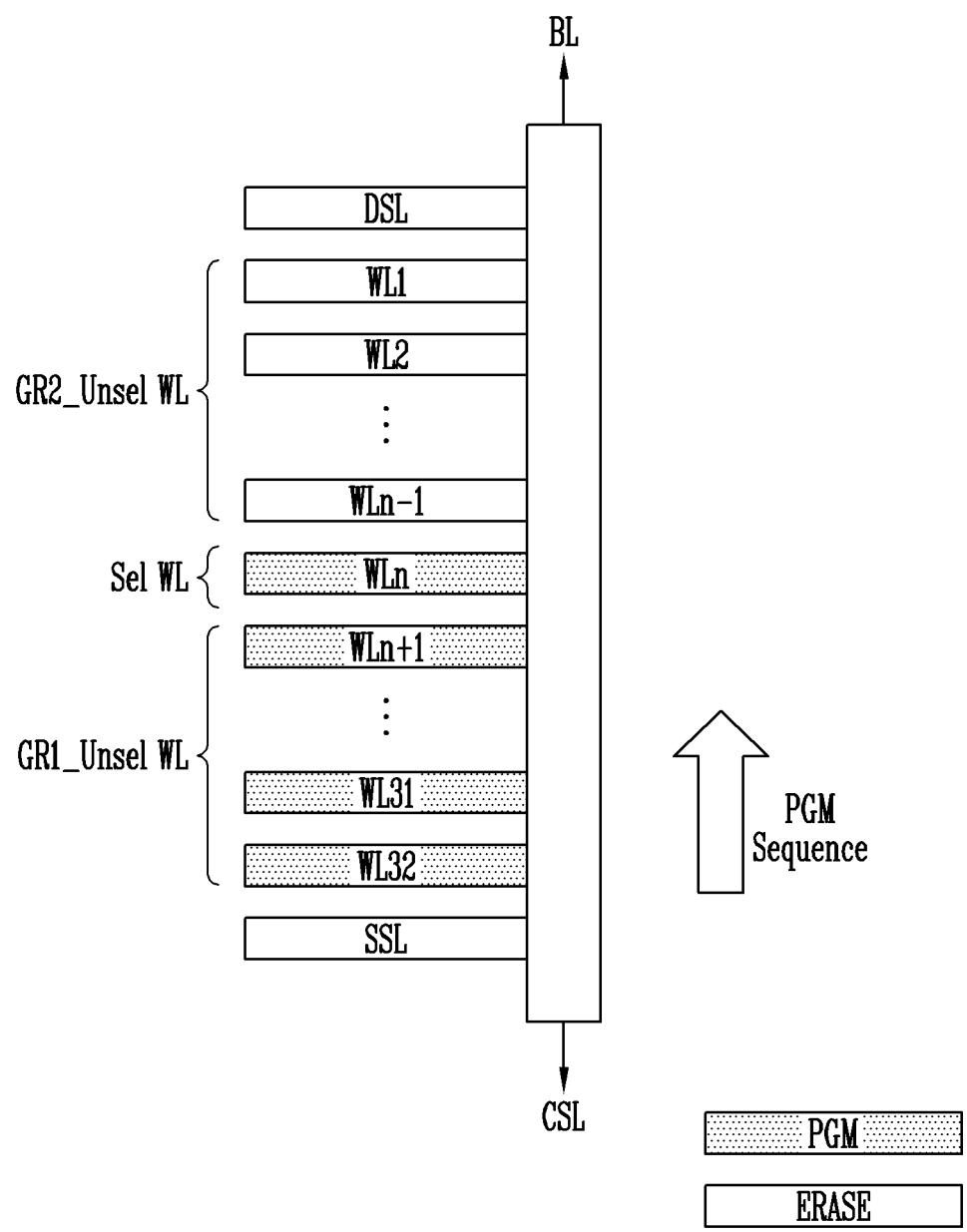
FIG. 10C is a diagram for describing the program sequence according to another embodiment of the present disclosure.

FIG. 10C is a diagram for describing the program sequence according to another embodiment of the present disclosure.

Referring to FIG. 10C, the memory cell string is connected to first to thirty-second word lines WL1 to WL32. The number of word lines connected to the memory cell string is not limited to the present embodiment.

In FIG. 10C, the n-th word line WLn may be the selected word line Sel WL on which the program operation is currently to be performed. The first unselected word line group GR1_Unsel WL may include (n+1)-th to thirty-second word lines WLn+1 to WL32. The second unselected word line group GR2_Unsel WL may include first to (n−1)-th word lines WL1 to WLn−1.

The program operation may be performed in a direction from the source select line SSL to the drain select line DSL. Therefore, the first unselected word line group GR1_Unsel WL may include word lines positioned between the source select line SSL and the selected word line Sel WL. The second unselected word line group GR2_Unsel WL may include word lines positioned between the selected word line Sel WL and the drain select line DSL.

Alternatively, the first unselected word line group GR1_Unsel WL may include the unselected word line on which the program operation is performed, and the second unselected word line group GR2_Unsel WL may include the unselected word line on which the program operation is to be performed. The word line on which the program operation is to be performed may be the word line connected to the memory cell of the erase state.

Figure 11:
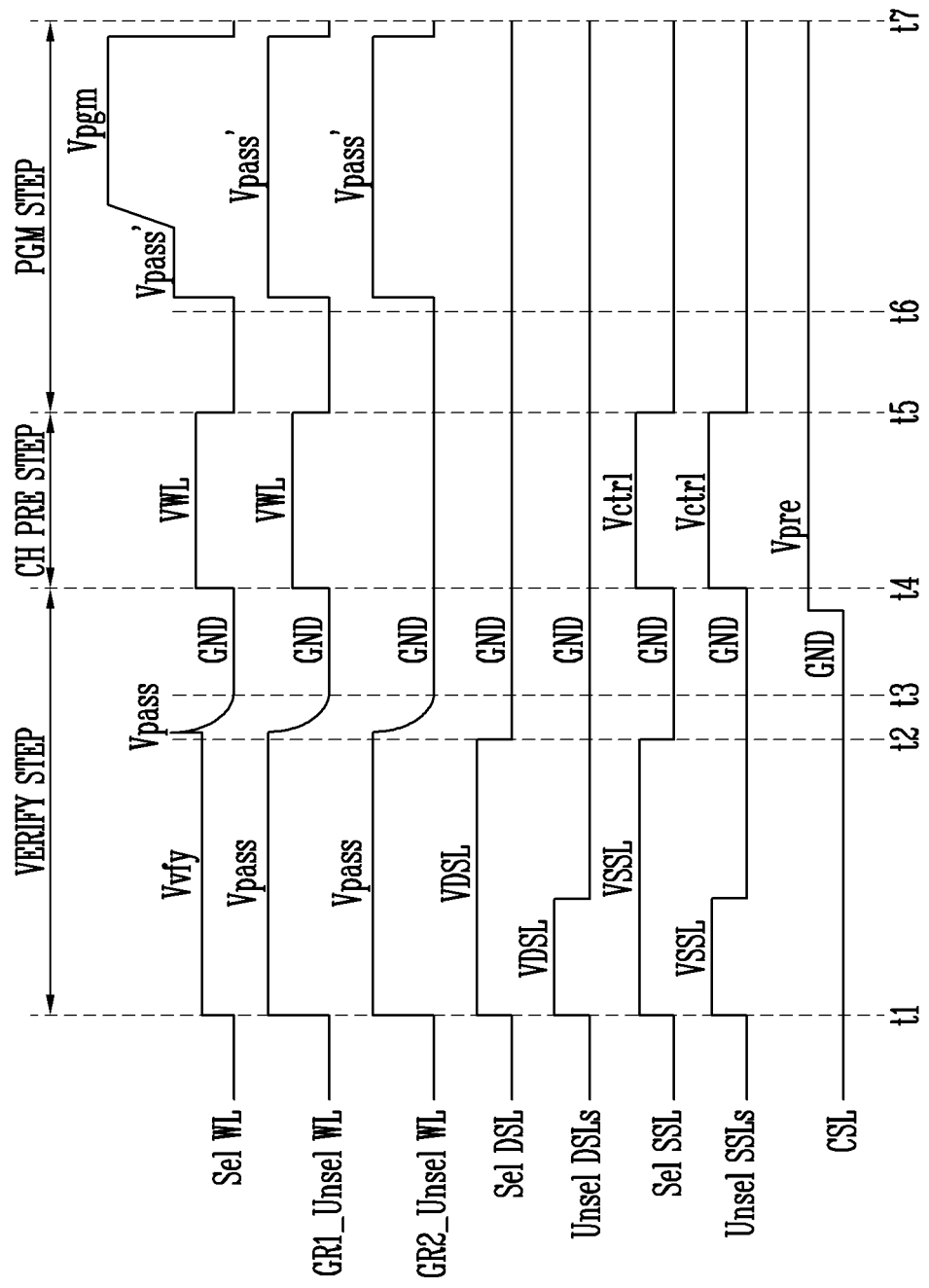
FIG. 11 is a diagram for describing a channel precharge operation through a common source line in the program operation.

FIG. 11 is a diagram for describing the channel precharge operation through the common source line in the program operation.

Referring to FIG. 11, the program operation may include a program voltage apply step PGM STEP, a verify step VERIFY STEP, and a channel precharge step CH PRE STEP.

A period t1 to t4 may represent the verify step VERIFY STEP, a period t4 to t5 may represent the channel precharge step CH PRE STEP, and a period t5 to t7 may represent the program voltage apply step PGM STEP. The memory device may perform the program voltage apply step before t1.

The memory cells may be sequentially programmed according to a sequence of the word line. Therefore, memory cells connected to word lines programmed prior to the selected word line Sel WL among the unselected word lines may be programmed, and memory cells connected to word lines to be programmed later than the selected word line Sel WL may have a threshold voltage corresponding to an erase state.

In FIG. 11, as described with reference to FIG. 10B, the memory device sequentially performs the program operation in a direction from a word line WL adjacent to the drain select line DSL to a word line WL adjacent to the source select line SSL. Therefore, memory cells connected to unselected word lines positioned between the selected word line Sel WL and the source select line SSL may be the memory cells on which the program operation is to be performed. In addition, memory cells connected to unselected word lines positioned between the selected word line Sel WL and the drain select line DSL may be memory cells on which the program operation is already performed.

In FIG. 11, the first unselected word line group GR1_Unsel WL may include the unselected word lines positioned between the selected word line Sel WL and the drain select line DSL. The second unselected word line group GR2_Unsel WL may include the unselected word lines positioned between the selected word line Sel WL and the source select line SSL.

Since the memory cells connected to the first unselected word line group GR1_Unsel WL are programmed first before the selected word line Sel WL, the memory cells connected to the first unselected word line group GR1_Unsel WL may be already programmed with a threshold voltage corresponding to stored data. Since the memory cells connected to the second unselected word line group GR2_Unsel WL are programmed later than the selected word line Sel WL, the memory cells connected to the second unselected word line group GR2_Unsel WL may be memory cells having the erase state.

Referring to FIG. 9, the verify step VERIFY STEP may include the precharge period, the evaluation period, and the discharge period. In the verify step VERIFY STEP, t1 to t2 may be the precharge period, t2 to t3 may be the evaluation period, and t3 to t4 may be the discharge period.

In the verify step VERIFY STEP, a ground voltage GND may be applied to the common source line CSL.

At t1 to t3, the verify voltage Vvfy may be applied to the selected word line Sel WL, and the verify pass voltage Vpass may be applied to the unselected word lines. The verify voltage Vvfy may be a voltage for determining a program state of the selected memory cells. The verify pass voltage Vpass may be a voltage for turning on the memory cells so that the memory cells connected to the unselected word lines do not affect the voltage of the bit line.

In FIG. 11, the memory block includes four sub blocks. However, the number of sub blocks included in the memory block is not limited to the present embodiment. Among the plurality of sub blocks, a sub block including selected memory cell strings on which a program operation is performed may be a selected sub block. Among the plurality of sub blocks, a sub block including unselected memory cell strings on which the program operation is not performed may be an unselected sub block.

At t1, a drain select voltage VDSL for turning on the drain select transistor may be applied to a selected drain select line Sel DSL, which is a drain select line connected to the selected sub block. In addition, the drain select voltage VDSL for turning on the drain select transistor may be applied to an unselected drain select lines Unsel DSLs, which are drain select lines connected to the unselected sub blocks. This is for preventing a channel potential of the unselected sub block from being excessively increased by the verify pass voltage Vpass of a high potential applied to the unselected word lines GR1_Unsel WL and GR2_Unsel WL.

At t1, a source select voltage VSSL for turning on the source select transistor may be applied to a selected source select line Sel SSL, which is a source select line connected to the selected sub block. In addition, the source select voltage VSSL for turning on the source select transistor may be applied to unselected source select line Unsel SSLs, which is a source select line connected to the unselected sub blocks. This is for preventing the channel potential of the unselected sub blocks from being excessively increased by the verify pass voltage Vpass of the high potential applied to the unselected word lines GR1_Unsel WL and GR2_Unsel WL.

A channel initialization operation may be performed in the precharge period t1 to t2 of the verify step VERIFY STEP. The channel initialization operation may be an operation of applying the drain select voltage VDSL to all drain select lines Sel DSL and Unsel DSLs and applying the source select voltage VSSL to all source select lines Sel SSL and Unsel SSLs to stabilize the channel potential.

In the evaluation period t2 to t3 of the verify step VERIFY STEP, the drain select voltage VDSL applied to the unselected drain select lines Unsel DSLs and the source select voltage VSSL applied to the unselected source select lines Unsel SSLs may be discharged. The ground voltage GND may be applied to the unselected drain select lines Unsel DSLs and the unselected source select lines Unsel SSLs. This allows the unselected memory cell string to be separated from the common source line CSL and to be in a floating state.

At t2, a potential of the selected word line Sel WL may be increased to a level of the verify pass voltage Vpass. Alternatively, in an embodiment, at t2, the voltage applied to the selected word line Sel WL may be a voltage of the same level as that of the voltage applied to the unselected word lines GR1_Unsel WL and GR2_Unsel WL.

Since a distance between the word lines is narrow, a capacitive coupling phenomenon may occur between the word lines. In the discharge period, all word lines are simultaneously discharged to the ground voltage corresponding to 0V or a very low specific voltage. Therefore, due to the capacitive coupling phenomenon between the word lines, a voltage of a specific word line may not be stably discharged to a ground voltage level. That is, the unselected word lines may be slowly discharged due to an RC delay, and the potential of the selected word line Sel WL may be instantaneously lowered to a negative voltage lower than the ground voltage GND by capacitive coupling with adjacent unselected word lines.

Therefore, when the discharge is performed after the voltage of the selected word line Sel WL is adjusted to the same level as that of the voltage applied to the adjacent unselected word lines GR1_Unsel WL and GR2_Unsel WL, more stable discharge is possible.

In the discharge period t3 to t4 of the verify step VERIFY STEP, potentials of the selected drain select line Sel DSL, the selected source select line Sel SSL, the selected word line Sel WL, and the unselected word lines GR1_Unsel WL and GR2_Unsel WL may be discharged to the ground voltage GND.

As the potentials of all word lines are discharged to the ground voltage GND, the channel negative boosting may occur as described with reference to FIG. 10A.

Therefore, at t4 to t5 that is the channel precharge step CH PRE STEP, the channel precharge operation through the common source line CSL may be performed to prevent the channel negative boosting.

A precharge voltage Vpre may be applied to the common source line CSL for the channel precharge operation. A control voltage Vctrl may be applied to the source select lines Sel SSL and Unsel SSLs. The control voltage Vctrl may be a voltage for turning on the source select transistors to transfer the precharge voltage Vpre applied to the common source line CSL to the channel region of the memory block. This allows the memory cell string of the memory block to be connected to the common source line CSL.

The ground voltage GND may be applied to the drain select lines Sel DSL and Unsel DSLs. Therefore, the drain select transistors are turned off and the memory cell string of the memory block is separated from the bit line.

A word line voltage VWL may be applied to the selected word line Sel WL and the first unselected word line group GR1_Unsel WL. The ground voltage GND may be applied to the second unselected word line group GR2_Unsel WL. The word line voltage VWL may be lower than the verify voltage Vvfy. The word line voltage VWL may be higher than or equal to the control voltage Vctrl.

The threshold voltage of the memory cell that is already programmed may be higher than the threshold voltage of the memory cell that is in the erase state. Therefore, the memory device may apply the word line voltage VWL to the word line connected to the memory cell that is already programmed to form a current path more smoothly, thereby effectively performing channel boosting.

In another embodiment, the ground voltage GND may be applied to the unselected word lines except for the selected word line Sel WL. In another embodiment, the word line voltage VWL may be applied to the selected word line Sel WL and the word line adjacent to the selected word line, and the ground voltage GND may be applied to the remaining word lines.

After the channel precharge step CH PRE STEP, the program voltage apply step PGM STEP of the next program loop may be performed.

At t5 to t6, the word line voltage VWL applied to the selected word line Sel WL and the first unselected word line group GR1_Unsel WL may be discharged. The control voltage Vctrl applied to the source select lines Sel SSL and Unsel SSLs may be discharged.

At t6 to t7, a program pass voltage Vpass' may be applied to the selected word line Sel WL, and thereafter, the program voltage Vpgm may be applied. The program pass voltage Vpass' may be applied to the unselected word lines GR1_Unsel WL and GR2_Unsel WL.

That is, the potential of the selected word line Sel WL may increase to the program pass voltage Vpass' together with the unselected word lines GR1_Unsel WL and GR2_Unsel WL, and then increase to the program voltage Vpgm. Therefore, a coupling phenomenon due to a capacitance between the word lines may be alleviated.

Figure 12A:
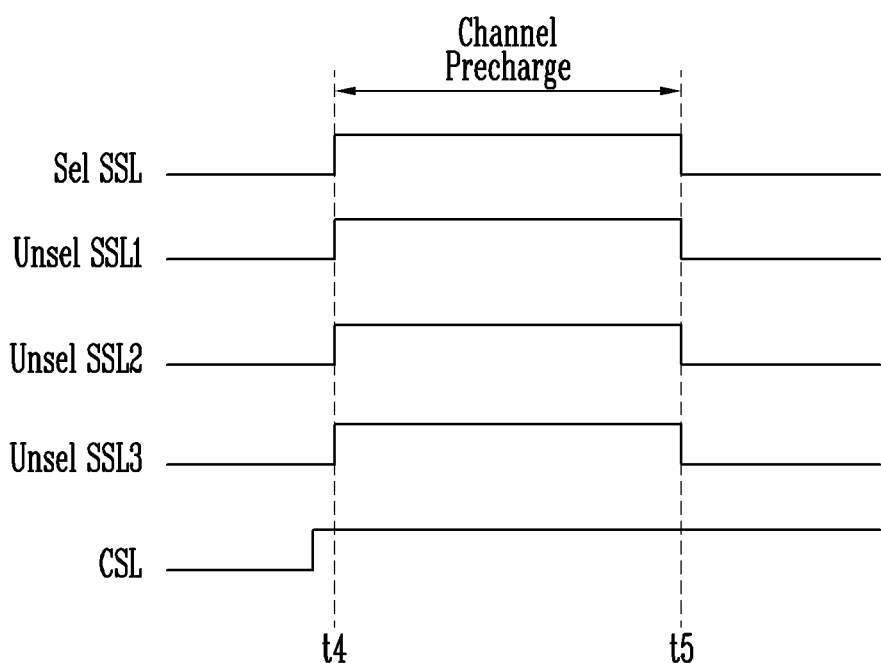
FIG. 12A is a diagram for describing the channel precharge operation through the common source line of FIG. 11 in detail.

FIG. 12A is a diagram for describing the channel precharge operation through the common source line of FIG. 11 in detail.

Referring to FIG. 12A, the channel precharge operation described with reference to the period t4 to t5 of FIG. 11 will be described in detail.

The memory block may include first to fourth sub blocks. The number of sub blocks included in the memory block is not limited to the present embodiment.

When the program operation is performed on the first sub block among the first to fourth sub blocks, a source select line connected to the first sub block may be the selected source select line Sel SSL. A source select line connected to the second sub block may be a first unselected source select line Unsel SSL1. A source select line connected to the third sub block may be a second unselected source select line Unsel SSL2. A source select line connected to the fourth sub block may be a third unselected source select line Unsel SSL3.

During the period t4 to t5, the control voltage Vctrl may be applied to all source select lines. The control voltage Vctrl may be a voltage for turning on the source select transistor to transfer the precharge voltage applied to the common source line CSL to the channel region of the memory block. Therefore, all of the source select transistors connected to the source select lines may be turned on, and the precharge voltage applied to the common source line CSL may be transferred to the channel region of the memory block including the memory cell strings.

Figure 12B:
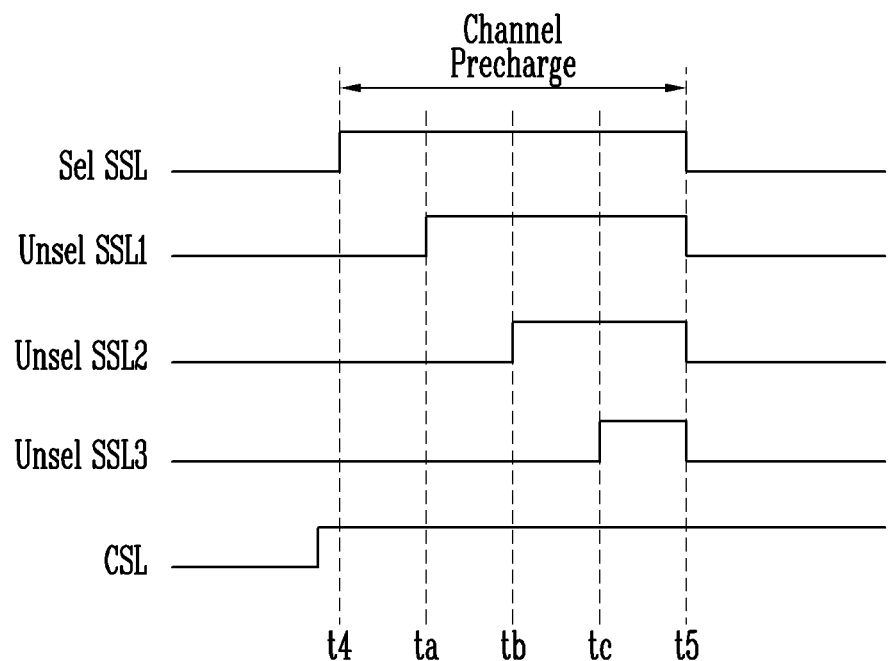
FIG. 12B is a diagram for describing an embodiment of the channel precharge operation of FIG. 12A.

FIG. 12B is a diagram for describing an embodiment of the channel precharge operation of FIG. 12A.

Referring to FIG. 12B, during the channel precharge operation, the control voltage Vctrl may be applied to the source select lines at different time points.

For example, the control voltage Vctrl may be applied to the selected source select line Sel SSL at a time point t4. The control voltage Vctrl may be applied to the first unselected source select line Unsel SSL1 at a time point ta. The control voltage Vctrl may be applied to the second unselected source select line Unsel SSL2 at a time point tb. The control voltage Vctrl may be applied to the third unselected source select line Unsel SSL3 at a time point tc.

In a case of FIG. 12A, the control voltage Vctrl may be simultaneously applied to all source select lines, and the channel region of all memory cell strings included in the memory block may be simultaneously precharged. As described above, when the channel region of all memory cell strings are simultaneously precharged, a peak current may instantaneously occur. The peak current may damage an internal circuit of the memory device and cause disturbance of the memory cell and instability of the power supply.

As the number of sub blocks included in the memory block increases, a peak current issue may be intensified. Specifically, as the number of memory cell strings in the memory block increases due to an increase of a stack of the memory device, a capacitance of the channel region of the memory block may increase. When the capacitance of the channel region of the memory block increases, instability of a power supply current Icc may be caused when the channel region of all memory cell strings are simultaneously precharged.

Referring to FIG. 12B, during the channel precharge operation, the control voltage Vctrl may not applied to all source select lines simultaneously, but may be applied at different time points for each source select line. Therefore, since the channel region of the memory cell strings is precharged with a time difference, the occurrence of the peak current may be prevented and the power supply current Icc may be stabilized.

Figure 12C:
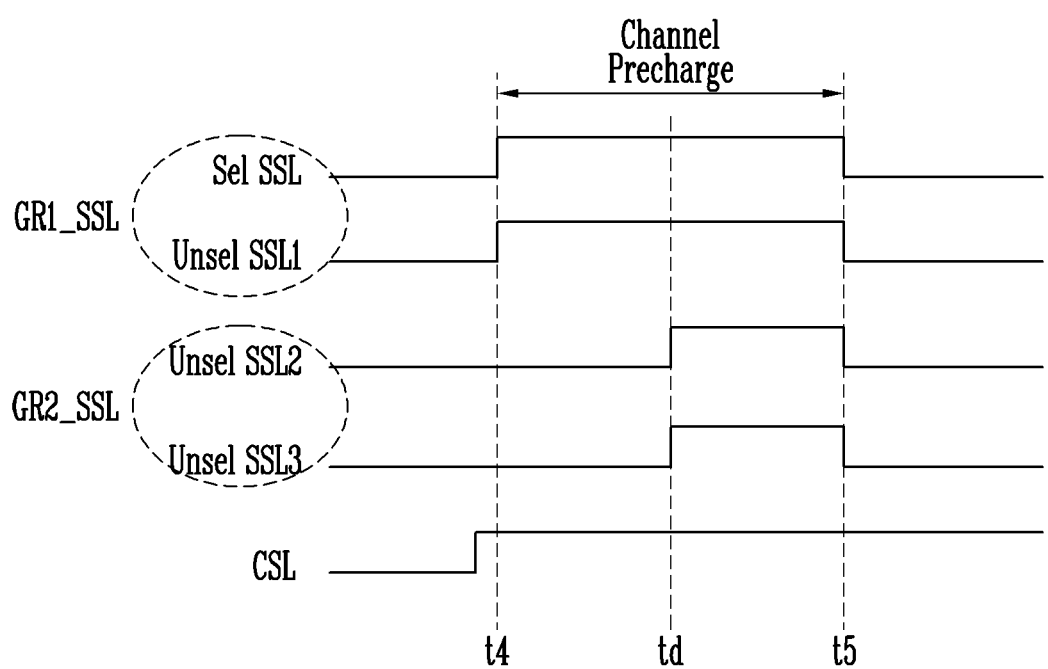
FIG. 12C is a diagram for describing another embodiment of the channel precharge operation of FIG. 12A.

FIG. 12C is a diagram for describing another embodiment of the channel precharge operation of FIG. 12A.

Referring to FIG. 12C, the source select lines may be divided into a plurality of source select line groups, and the control voltage Vctrl may be applied at different time points for each source select line group during the channel precharge operation.

A first source select line group GR1_SSL may include the selected source select line Sel SSL and the first unselected source select line Unsel SSL1. A second source select line group GR2_SSL may include the second unselected source select line Unsel SSL2 and a third unselected source select line Unsel SSL3. The number of source select line groups and the number of source select lines included in each source select line group are not limited to the present embodiment.

The control voltage Vctrl may be applied to the first source select line group GR1_SSL at a time point t4. The control voltage Vctrl may be applied to the second source select line group GR2_SSL at a time point td.

In comparison with FIG. 12B, the channel precharge operation is performed by mapping the source select lines to a group unit. Therefore, control of the channel precharge operation may be simplified.

Figure 13:
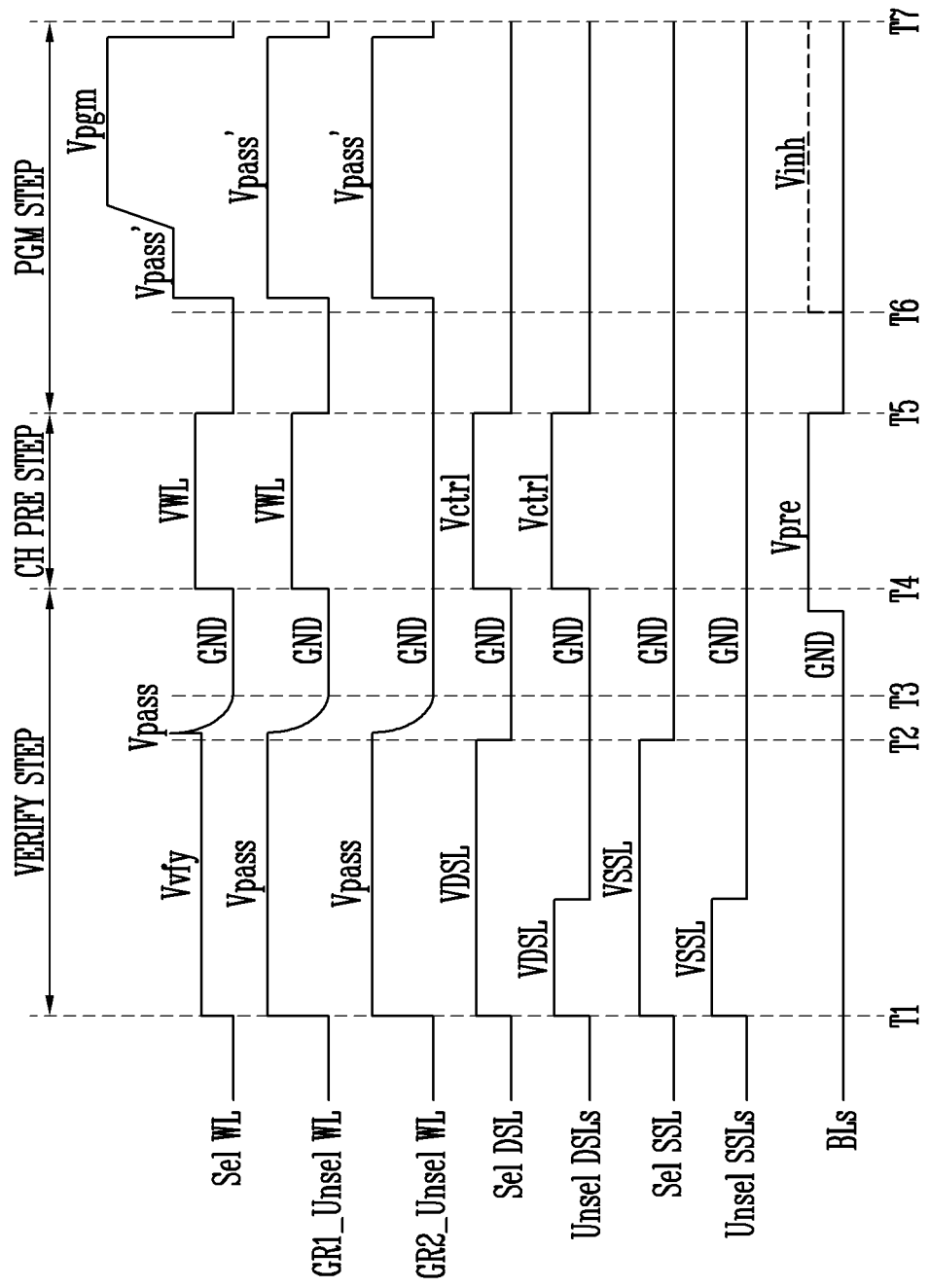
FIG. 13 is a diagram for describing the channel precharge operation through a bit line in the program operation.

FIG. 13 is a diagram for describing the channel precharge operation through the bit line in the program operation.

Referring to FIG. 13, the program operation may include the program voltage apply step PGM STEP, the verify step VERIFY STEP, and the channel precharge step CH PRE STEP.

A period T1 to T4 may represent the verify step VERIFY STEP, a period T4 to T5 may represent the channel precharge step CH PRE STEP, and a period T5 to T7 may represent the program voltage apply step PGM STEP. The memory device may perform the program voltage apply step before T1.

The memory cells may be sequentially programmed according to a sequence of the word line. Therefore, the memory cells connected to the word lines programmed prior to the selected word line Sel WL among the unselected word lines may be programmed, and the memory cells connected to the word lines to be programmed later than the selected word line Sel WL may have the threshold voltage corresponding to the erase state.

In FIG. 13, as described with reference to FIG. 10C, the memory device sequentially performs the program operation in the direction from the word line WL adjacent to the source select line SSL to the word line WL adjacent to the drain select line DSL. Therefore, the memory cells connected to the unselected word lines positioned between the selected word line Sel WL and the drain select line DSL may be the memory cells on which the program operation is to be performed. In addition, the memory cells connected to the unselected word lines positioned between the selected word line Sel WL and the source select line SSL may be the memory cells on which the program operation is already performed.

In FIG. 13, the first unselected word line group GR1_Unsel WL may include the unselected word lines positioned between the selected word line Sel WL and the source select line SSL. The second unselected word line group GR2_Unsel WL may include the unselected word lines positioned between the selected word line Sel WL and the drain select line DSL.

Since the memory cells connected to the first unselected word line group GR1_Unsel WL are programmed first before the selected word line Sel WL, the memory cells connected to the first unselected word line group GR1_Unsel WL may be programmed with the threshold voltage corresponding to the stored data. Since the memory cells connected to the second unselected word line group GR2_Unsel WL are programmed later than the selected word line Sel WL, the memory cells connected to the second unselected word line group GR2_Unsel WL may be the memory cells of the erase state.

Referring to FIG. 9, the verify step VERIFY STEP may include the precharge period, the evaluation period, and the discharge period. In the verify step VERIFY STEP, T1 to T2 may be the precharge period, T2 to T3 may be the evaluation period, and T3 to T4 may be the discharge period.

In the verify step VERIFY STEP, the ground voltage GND may be applied to the plurality of bit lines BLs connected to the memory cell strings of the memory block.

In T1 to T3, the verify voltage Vvfy may be applied to the selected word line Sel WL, and the verify pass voltage Vpass may be applied to the unselected word lines. The verify voltage Vvfy may be a voltage for determining the program state of the selected memory cells. The verify pass voltage Vpass may be a voltage for turning on the memory cells so that the memory cells connected to the unselected word lines do not affect the voltage of the bit line.

In FIG. 13, the memory block includes four sub blocks. However, the number of sub blocks included in the memory block is not limited to the present embodiment. Among the plurality of sub blocks, a sub block including selected memory cell strings on which a program operation is performed may be a selected sub block. Among the plurality of sub blocks, a sub block including unselected memory cell strings on which the program operation is not performed may be an unselected sub block.

At T1, a drain select voltage VDSL for turning on the drain select transistor may be applied to a selected drain select line Sel DSL, which is a drain select line connected to the selected sub block. In addition, the drain select voltage VDSL for turning on the drain select transistor may be applied to an unselected drain select lines Unsel DSLs, which are drain select lines connected to the unselected sub blocks. This is for preventing a channel potential of the unselected sub block from being excessively increased by the verify pass voltage Vpass of a high potential applied to the unselected word lines GR1_Unsel WL and GR2_Unsel WL.

At T1, a source select voltage VSSL for turning on the source select transistor may be applied to a selected source select line Sel SSL, which is a source select line connected to the selected sub block. In addition, the source select voltage VSSL for turning on the source select transistor may be applied to unselected source select line Unsel SSLs, which is a source select line connected to the unselected sub blocks. This is for preventing the channel potential of the unselected sub blocks from being excessively increased by the verify pass voltage Vpass of the high potential applied to the unselected word lines GR1_Unsel WL and GR2_Unsel WL.

A channel initialization operation may be performed in the precharge period T1 to T2 of the verify step VERIFY STEP. The channel initialization operation may be an operation of applying the drain select voltage VDSL to all drain select lines Sel DSL and Unsel DSLs and applying the source select voltage VSSL to all source select lines Sel SSL and Unsel SSLs to stabilize the channel potential.

In the evaluation period T2 to T3 of the verify step VERIFY STEP, the drain select voltage VDSL applied to the unselected drain select lines Unsel DSLs and the source select voltage VSSL applied to the unselected source select lines Unsel SSLs may be discharged. The ground voltage GND may be applied to the unselected drain select lines Unsel DSLs and the unselected source select lines Unsel SSLs. This allows the unselected memory cell string to be separated from the common source line CSL and to be in a floating state.

At T2, a potential of the selected word line Sel WL may be increased to a level of the verify pass voltage Vpass. Alternatively, in an embodiment, at T2, the voltage applied to the selected word line Sel WL may be a voltage of the same level as that of the voltage applied to the unselected word lines GR1_Unsel WL and GR2_Unsel WL.

Since a distance between the word lines is narrow, a capacitive coupling phenomenon may occur between the word lines. In the discharge period, all word lines are simultaneously discharged to the ground voltage corresponding to 0V or a very low specific voltage. Therefore, due to the capacitive coupling phenomenon between the word lines, a voltage of a specific word line may not be stably discharged to a ground voltage level. That is, the unselected word lines may be slowly discharged due to an RC delay, and the potential of the selected word line Sel WL may be instantaneously lowered to a negative voltage lower than the ground voltage GND by capacitive coupling with adjacent unselected word lines.

Therefore, when the discharge is performed after the voltage of the selected word line Sel WL is adjusted to the same level as that of the voltage applied to the adjacent unselected word lines GR1_Unsel WL and GR2_Unsel WL, more stable discharge is possible.

In the discharge period T3 to T4 of the verify step VERIFY STEP, potentials of the selected drain select line Sel DSL, the selected source select line Sel SSL, the selected word line Sel WL, and the unselected word lines GR1_Unsel WL and GR2_Unsel WL may be discharged to the ground voltage GND.

As the potentials of all word lines are discharged to the ground voltage GND, the channel negative boosting may occur as described with reference to FIG. 10A.

Therefore, at T4 to T5, that is the channel precharge step CH PRE STEP, the channel precharge operation through the plurality of bit lines BLs may be performed to prevent the channel negative boosting.

A precharge voltage Vpre may be applied to the plurality of bit lines BLs for the channel precharge operation. A control voltage Vctrl may be applied to the drain select lines Sel DSL and Unsel DSLs. The control voltage Vctrl may be a voltage for turning on the drain select transistors to transfer the precharge voltage Vpre applied to the plurality of bit lines BLs to the channel region of the memory block. This allows the memory cell string of the memory block to be connected to the bit line.

The ground voltage GND may be applied to the source select lines Sel SSL and Unsel SSLs. Therefore, the source select transistors are turned off and the memory cell string of the memory block is separated from the common source line.

A word line voltage VWL may be applied to the selected word line Sel WL and the first unselected word line group GR1_Unsel WL. The ground voltage GND may be applied to the second unselected word line group GR2_Unsel WL. The word line voltage VWL may be lower than the verify voltage Vvfy. The word line voltage VWL may be higher than or equal to the control voltage Vctrl.

The threshold voltage of the memory cell that is already programmed may be higher than the threshold voltage of the memory cell that is in the erase state. Therefore, the memory device may apply the word line voltage VWL to the word line connected to the memory cell that is already programmed to form a current path more smoothly, thereby effectively performing channel boosting.

In another embodiment, the ground voltage GND may be applied to the unselected word lines except for the selected word line Sel WL. In another embodiment, the word line voltage VWL may be applied to the selected word line Sel WL and the word line adjacent to the selected word line, and the ground voltage GND may be applied to the remaining word lines.

After the channel precharge step CH PRE STEP, the program voltage apply step PGM STEP of the next program loop may be performed.

At T5 to T6, the word line voltage VWL applied to the selected word line Sel WL and the first unselected word line group GR1_Unsel WL may be discharged. The control voltage Vctrl applied to the source select lines Sel SSL and Unsel SSLs may be discharged. The precharge voltage Vpre applied to the plurality of bit lines BLs may be discharged.

At T6 to T7, a program pass voltage Vpass' may be applied to the selected word line Sel WL, and thereafter, the program voltage Vpgm may be applied. The program pass voltage Vpass' may be applied to the unselected word lines GR1_Unsel WL and GR2_Unsel WL.

That is, the potential of the selected word line Sel WL may increase to the program pass voltage Vpass' together with the unselected word lines GR1_Unsel WL and GR2_Unsel WL, and then increase to the program voltage Vpgm. Therefore, a coupling phenomenon due to a capacitance between the word lines may be alleviated.

A program inhibit voltage Vinh or a program permission voltage GND may be applied to the plurality of bit lines BLs according to whether the program on the memory cell connected to each bit line is completed. The program inhibit voltage Vinh may be applied to a bit line connected to a program inhibit cell among the selected memory cells connected to the selected word line Sel WL. The program inhibit cell may be a memory cell on which a program is completed to a target state or a memory cell that is required not be programmed.

The program permission voltage GND may be applied to a bit line connected to a program permission cell among the selected memory cells. The program permission cell may be a memory cell on which the program is not completed to the target state among the memory cells to be programmed.

Figure 14A:
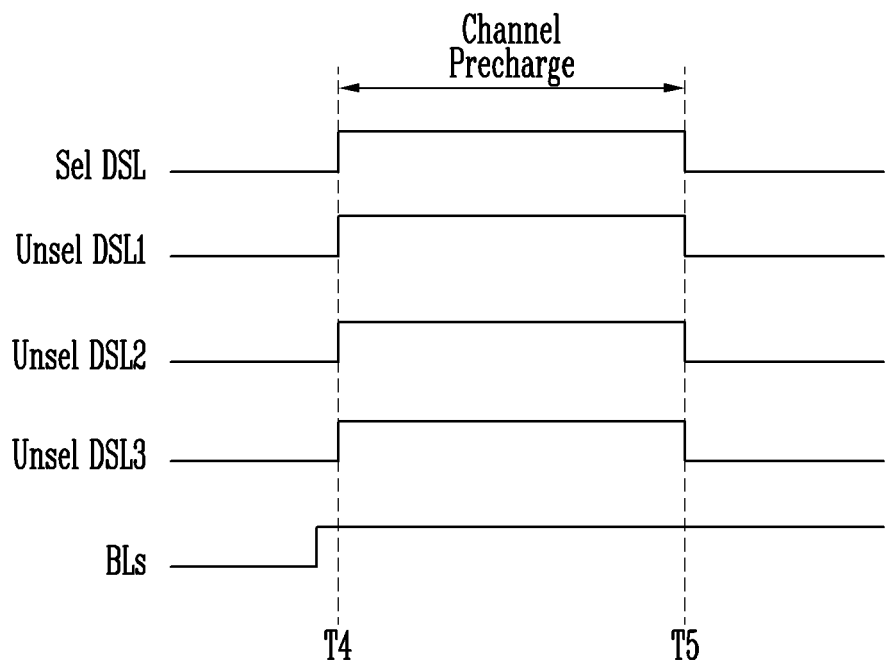
FIG. 14A is a diagram for describing the channel precharge operation through the bit line of FIG. 13 in detail.

FIG. 14A is a diagram for describing the channel precharge operation through the bit line of FIG. 13 in detail.

Referring to FIG. 14A, the channel precharge operation described with reference to the period T4 to T5 of FIG. 13 will be described in detail.

The memory block may include first to fourth sub blocks. The number of sub blocks included in the memory block is not limited to the present embodiment.

When the program operation is performed on the first sub block among the first to fourth sub blocks, a drain select line connected to the first sub block may be the selected drain select line Sel DSL. A drain select line connected to the second sub block may be a first unselected drain select line Unsel DSL1. A drain select line connected to the third sub block may be a second unselected drain select line Unsel DSL2. A drain select line connected to the fourth sub block may be a third unselected drain select line Unsel DSL3.

During the period T4 to T5, the control voltage Vctrl may be applied to all drain select lines. The control voltage Vctrl may be a voltage for turning on the drain select transistor to transfer the precharge voltage applied to the bit lines BLs to the channel region of the memory block. Therefore, all of the drain select transistors connected to the drain select lines may be turned on, and the precharge voltage applied to the bit lines BLs may be transferred to the channel region of the memory block including the memory cell strings.

Figure 14B:
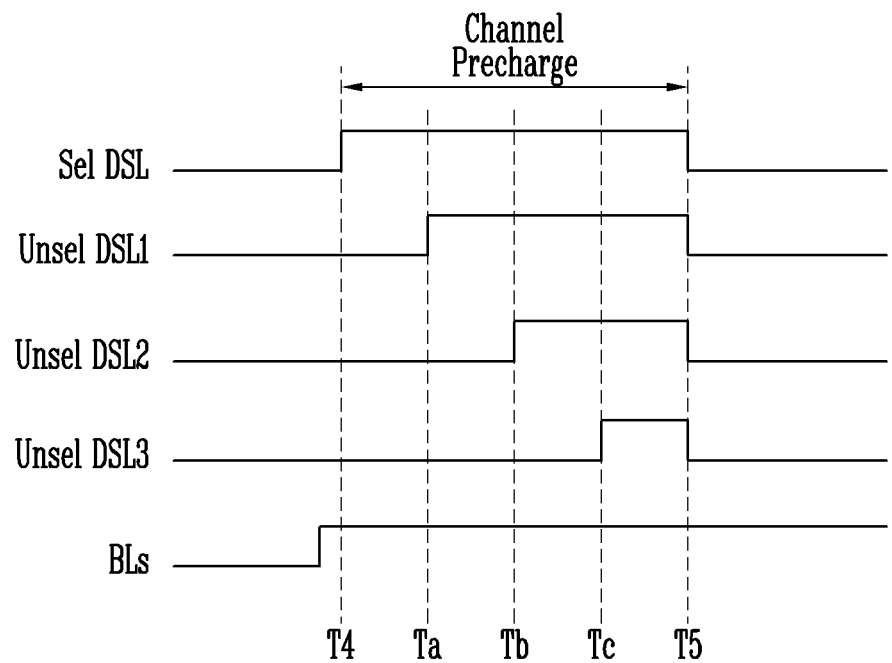
FIG. 14B is a diagram for describing an embodiment of the channel precharge operation of FIG. 14A.

FIG. 14B is a diagram for describing an embodiment of the channel precharge operation of FIG. 14A.

Referring to FIG. 14B, during the channel precharge operation, the control voltage Vctrl may be applied to the drain select lines at different time points.

For example, the control voltage Vctrl may be applied to the selected drain select line Sel DSL at a time point T4. The control voltage Vctrl may be applied to the first unselected drain select line Unsel DSL1 at a time point Ta. The control voltage Vctrl may be applied to the second unselected drain select line Unsel DSL2 at a time point Tb. The control voltage Vctrl may be applied to the third unselected drain select line Unsel DSL3 at a time point Tc.

In a case of FIG. 14A, the control voltage Vctrl may be simultaneously applied to all drain select lines, and the channel region of all memory cell strings included in the memory block may be simultaneously precharged. As described above, when the channel region of all memory cell strings are simultaneously precharged, a peak current may instantaneously occur. The peak current may damage an internal circuit of the memory device and cause disturbance of the memory cell and instability of the power supply.

As the number of sub blocks included in the memory block increases, a peak current issue may be intensified. Specifically, as the number of memory cell strings in the memory block increases due to an increase of a stack of the memory device, a capacitance of the channel region of the memory block may increase. When the capacitance of the channel region of the memory block increases, instability of a power supply current Icc may be caused when the channel region of all memory cell strings are simultaneously precharged.

Referring to FIG. 14B, during the channel precharge operation, the control voltage Vctrl may not be applied to all drain select lines simultaneously, but may be applied at different time points for each drain select line. Therefore, since the channel region of the memory cell strings is precharged with a time difference, the occurrence of the peak current may be prevented and the power supply current Icc may be stabilized.

Figure 14C:
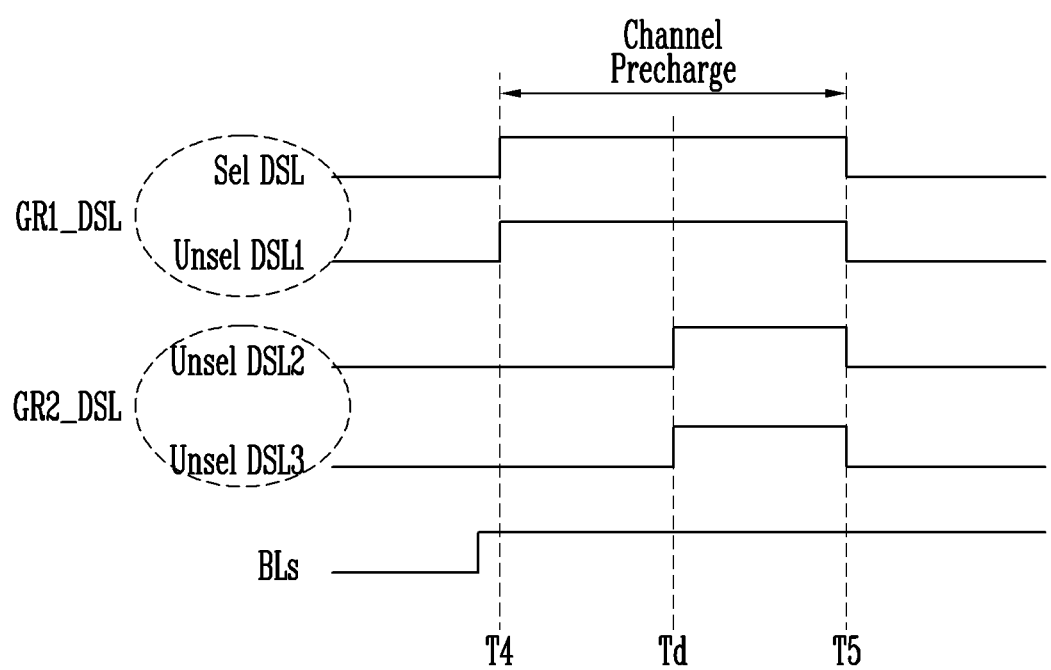
FIG. 14C is a diagram for describing another embodiment of the channel precharge operation of FIG. 14A.

FIG. 14C is a diagram for describing another embodiment of the channel precharge operation of FIG. 14A.

Referring to FIG. 14C, the drain select lines may be divided into a plurality of drain select line groups, and the control voltage Vctrl may be applied at different time points for each drain select line group during the channel precharge operation.

A first drain select line group GR1_DSL may include the selected drain select line Sel DSL and the first unselected drain select line Unsel DSL1. A second drain select line group GR2_DSL may include the second unselected drain select line Unsel DSL2 and a third unselected drain select line Unsel DSL3. The number of drain select line groups and the number of drain select lines included in each drain select line group are not limited to the present embodiment.

The control voltage Vctrl may be applied to the first drain select line group GR1_DSL at a time point T4. The control voltage Vctrl may be applied to the second drain select line group GR2_DSL at a time point Td.

In comparison with FIG. 14B, the channel precharge operation is performed by mapping the drain select lines to a group unit. Therefore, control of the channel precharge operation may be simplified.

Figure 15:
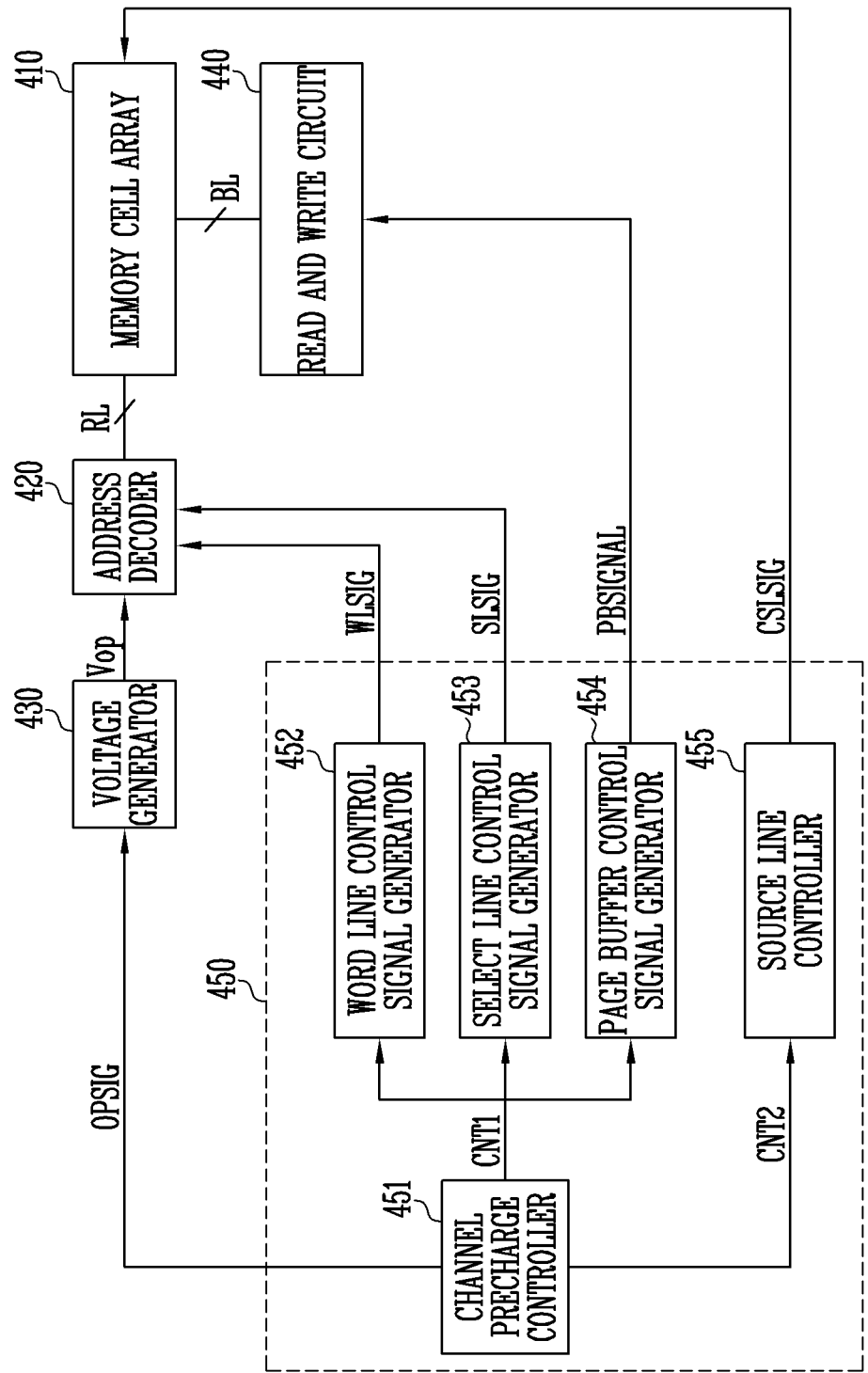
FIG. 15 is a diagram for describing a structure and an operation of the memory device of FIG. 2 according to an embodiment of the present disclosure.

FIG. 15 is a diagram for describing a structure and an operation of the memory device of FIG. 2 according to an embodiment of the present disclosure.

Referring to FIG. 15, the memory device may include a memory cell array 410, an address decoder 420, a voltage generator 430, a read and write circuit 440, and a program operation controller 450.

The memory cell array 410, the address decoder 420, the voltage generator 430, and the read and write circuit 440 may be respectively configured and operated identically to the memory cell array 110, the address decoder 121, the voltage generator 122, and the read and write circuit 123 described with reference to FIG. 2. Therefore, in FIG. 15, the description will focus on an operation of the program operation controller 450.

The program operation controller 450 may be included in the control logic 130 described with reference to FIG. 2.

Referring to FIG. 15, the program operation controller 450 may include a channel precharge controller 451, a word line control signal generator 452, a select line control signal generator 453, a page buffer control signal generator 454, and a source line controller 455.

The channel precharge controller 451 may control the peripheral circuits to perform the channel precharge step according to a program command input from a memory controller controlling the memory device.

Specifically, the channel precharge controller 451 may provide an operation signal OPSIG for generating voltages of various levels used in the channel precharge step to the voltage generator 430. The voltage generator 430 may generate channel precharge related voltages Vop used in the channel precharge step in response to the operation signal OPSIG and provide the channel precharge related voltages Vop to the address decoder 420.

In an embodiment, the channel precharge controller 451 may generate a first precharge control signal CNT1 to control an application timing of the channel precharge related voltages Vop applied to the row lines RL and the bit lines BL connected to the memory cell array 410. The channel precharge controller 451 may provide the generated first precharge control signal CNT1 to the word line control signal generator 452, the select line control signal generator 453, and the page buffer control signal generator 454.

The word line control signal generator 452 and the select line control signal generator 453 may provide a word line control signal WLSIG and a select line control signal SLSIG to the address decoder, in response to the first precharge control signal CNT1. The address decoder 420 may provide the channel precharge related voltages Vop generated by the voltage generator 430 to the memory cell array 410 at a timing determined by the word line control signal WLSIG and the select line control signal SLSIG.

The page buffer control signal generator 454 may provide a page buffer control signal PBSIGNAL for controlling the read and write circuit 440 to the read and write circuit 440, in response to the first precharge control signal CNT1. The read and write circuit 440 may provide a voltage to the bit lines BL connected to the memory cell array 410, in response to the page buffer control signal PBSIGNAL.

In an embodiment, the channel precharge controller 451 may generate a second precharge control signal CNT2 to control a timing at which a precharge voltage is applied to the common source line in the channel precharge step, and provide the generated second precharge control signal CNT2 to the source line controller 455.

The source line controller 455 may provide a common source line control signal CSLSIG to memory cell array 410 in response to the second precharge control signal CNT2 so that the precharge voltage is applied to the common source line of the memory cell array 410.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed, or parts of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Moreover, the embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A method of operating a memory device including a memory block including first and second sub blocks, the first sub block being connected to a first drain select line and a first source select line, the second sub block being connected to a second drain select line and a second source select line, and each of the first and second sub blocks being connected to a plurality of bit lines, a plurality of word lines, and a common source line, the method comprising:
    discharging a verify voltage applied to a selected word line among the plurality of word lines; and
    precharging a channel region of the memory block through the common source line,
    wherein the precharging comprises applying a control voltage to the first source select line and the second source select line at different time points.

2. The method of claim 1, wherein the precharging further comprises:
    applying a word line voltage to one or more word lines of the plurality of word lines; and
    applying a precharge voltage to the common source line while the word line voltage is applied to the one or more word lines.

3. The method of claim 2, wherein the applying the word line voltage comprises:
    applying the word line voltage to the selected word line and a first unselected word line group; and
    applying a ground voltage to a second unselected word line group, while the word line voltage is applied to the selected word line and the first unselected word line group,
    wherein the first unselected word line group includes unselected word lines positioned between the selected word line and the first or second drain select lines among the plurality of word lines, and
    wherein the second unselected word line group includes unselected word lines positioned between the selected word line and the first or second source select lines among the plurality of word lines.

4. The method of claim 2, wherein the applying the word line voltage comprises:
    applying the word line voltage to the selected word line and a first unselected word line group; and
    applying a ground voltage to a second unselected word line group while the word line voltage is applied to the selected word line and the first unselected word line group,
    wherein the first unselected word line group includes unselected word lines on which a program operation is performed among the plurality of word lines, and
    wherein the second unselected word line group includes unselected word lines on which the program operation is to be performed among the plurality of word lines.

5. The method of claim 1,
    wherein the memory block further includes third and fourth sub blocks, and
    wherein the precharging comprises:
    applying the control voltage to the first source select line and a third source select line corresponding to the third sub block at a first time point; and
    applying the control voltage to the second source select line and a fourth source select line corresponding to the fourth sub block at a second time point.

6. The method of claim 1, wherein the control voltage is a voltage for turning on source select transistors connected to either of the first and second source select lines to transfer a precharge voltage applied through the common source line to a channel region of the memory block.

7. The method of claim 1,
    wherein the first sub block comprises:
    first drain select transistors connected to the plurality of bit lines, and controlled by the first drain select line;
    first cell strings connected to the first drain select transistors, and controlled by the plurality of word lines; and
    first source select transistors connected between the first cell strings and the common source line, and controlled by the first source select line,
    wherein the second sub block comprises:
    second drain select transistors connected to the plurality of bit lines, and controlled by the second drain select line;
    second cell strings connected to the second drain select transistors, and controlled by the plurality of word lines; and
    second source select transistors connected between the second cell strings and the common source line, and controlled by the second source select line.

8. A method of operating a memory device including a memory block including first and second sub blocks, the first sub block being connected to a first drain select line and a first source select line, the second sub block being connected to a second drain select line and a second source select line, and each of the first and second sub blocks being connected to a plurality of bit lines, a plurality of word lines, and a common source line, the method comprising:
    discharging a verify voltage applied to a selected word line among the plurality of word lines; and
    precharging a channel region of the memory block through the plurality of bit lines, wherein the precharging comprises applying a control voltage to the first drain select line and the second drain select line at different time points.

9. The method of claim 8, wherein the precharging further comprises:
applying a word line voltage to one or more word lines of the plurality of word lines; and
applying a precharge voltage to the plurality of bit lines while the word line voltage is applied to the one or more word lines.

10. The method of claim 9, wherein the applying the word line voltage comprises:
applying the word line voltage to the selected word line and a first unselected word line group; and
applying a ground voltage to a second unselected word line group, while the word line voltage is applied to the selected word line and the first unselected word line group,
wherein the first unselected word line group includes unselected word lines positioned between the selected word line and the first or second source select lines among the plurality of word lines, and
wherein the second unselected word line group includes unselected word lines positioned between the selected word line and the first or second drain select lines among the plurality of word lines.

11. The method of claim 9, wherein the applying the word line voltage comprises:
applying the word line voltage to the selected word line and a first unselected word line group; and
applying a ground voltage to a second unselected word line group while the word line voltage is applied to the selected word line and the first unselected word line group,
wherein the first unselected word line group includes unselected word lines on which a program operation is performed among the plurality of word lines, and
wherein the second unselected word line group includes unselected word lines on which the program operation is to be performed among the plurality of word lines.

12. The method of claim 8,
wherein the memory block further includes third and fourth sub blocks, and
wherein the precharging comprises:
applying the control voltage to the first drain select line and a third drain select line corresponding to the third sub block at a first time point; and
applying the control voltage to the second drain select line and a fourth drain select line corresponding to the fourth sub block at a second time point.

13. The method of claim 8, wherein the control voltage is a voltage for turning on drain select transistors connected to either of the first and second source select lines to transfer a precharge voltage applied through the bit lines to a channel region of the memory block.

14. The method of claim 8,
wherein the first sub block comprises:
first drain select transistors connected to the plurality of bit lines and controlled by the first drain select line;
first cell strings connected to the first drain select transistors and controlled by the plurality of word lines; and
first source select transistors connected between the first cell strings and the common source line, and controlled by the first source select line, wherein the second sub block comprises:
second drain select transistors connected to the plurality of bit lines, and controlled by the second drain select line;
second cell strings connected to the second drain select transistors, and controlled by the plurality of word lines; and
second source select transistors connected between the second cell strings and the common source line, and controlled by the second source select line.

15. A memory device comprising:
a memory block including a first sub block connected to a first drain select line and a first source select line, and a second sub block connected to a second drain select line and a second source select line, and each of the first and second sub blocks being connected to a plurality of bit lines, a plurality of word lines and a common source line;
a peripheral circuit configured to perform a program loop including a program voltage apply step of applying a program voltage to a selected word line among the plurality of word lines, a verify step of verifying a program state of memory cells connected to the selected word line, and a step of precharging a channel region of the memory block through the common source line; and a program operation controller configured to control the peripheral circuit to transfer a precharge voltage to the channel region through the common source line or the plurality of bit lines, in the step of precharging the channel region, wherein the program operation controller controls the peripheral circuit to apply a control voltage to the first and second source select lines at different time points or to apply the control voltage to the first and second drain select lines at different time points during the step of the pre-charging.

16. The memory device of claim 15,
wherein the first sub block comprises:
first drain select transistors connected to the plurality of bit lines, and controlled by the first drain select line;
first cell strings connected to the first drain select transistors, and controlled by the plurality of word lines; and
first source select transistors connected between the first cell strings and the common source line, and controlled by the first source select line,
wherein the second sub block comprises:
second drain select transistors connected to the plurality of bit lines, and controlled by the second drain select line;
second cell strings connected to the second drain select transistors, and controlled by the plurality of word lines; and
second source select transistors connected between the second cell strings and the common source line, and controlled by the second source select line.

17. The memory device of claim 16, wherein the control voltage is a voltage for turning on the first and second drain select transistors or the first and second source select transistors to transfer the precharge voltage to the channel region.

18. The memory device of claim 15,
wherein the memory block further includes a third sub block connected to a third drain select line and a third source select line and a fourth sub block connected to a fourth drain select line and a fourth source select line, and wherein the program operation controller controls, in the step of precharging the channel region, the peripheral circuit to apply the control voltage to the first and third drain select lines at a first time point and apply the control voltage to the second and fourth drain select lines at a second time point, or apply the control voltage to the first and third source select lines at a third time point and apply the control voltage to the second and fourth source select lines at a fourth time point.

19. An operating method of a memory device, the operating method comprising: applying a pre charge voltage to a common line or a plurality of bit lines; pre charging a channel region of cell strings through the common line or the plurality of bit lines according to whether the pre charge voltage is applied to either the common line or the plurality of bit lines; turning on a first source selection transistor and a second source selection transistor among selection transistors included in the cell strings at different time points by using a control voltage while the channel region is pre charged through the common line; and turning on a first drain selection transistor and a second drain selection transistor among the selection transistors at different time points by using the control voltage while the channel region is pre charged through the plurality of the bit lines, and wherein the cell strings are included in different memory regions.

* * * * *